United States Patent
Yu et al.

(10) Patent No.: US 12,414,362 B2
(45) Date of Patent: Sep. 9, 2025

(54) FINS DISPOSED ON STACKS OF NANOSTRUCTURES WHERE THE NANOSTRUCTURES ARE WRAPPED AROUND BY A GATE

(71) Applicant: Taiwan Semiconductor Manufacturing Company, Ltd., Hsinchu (TW)

(72) Inventors: Li-Zhen Yu, New Taipei (TW); Huan-Chieh Su, Changhua County (TW); Lin-Yu Huang, Hsinchu (TW); Chih-Hao Wang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 611 days.

(21) Appl. No.: 17/849,725

(22) Filed: Jun. 27, 2022

(65) Prior Publication Data
US 2023/0420455 A1    Dec. 28, 2023

(51) Int. Cl.
| | |
|---|---|
| H10D 84/83 | (2025.01) |
| H01L 21/02 | (2006.01) |
| H10D 30/01 | (2025.01) |
| H10D 30/43 | (2025.01) |
| H10D 30/67 | (2025.01) |
| H10D 62/10 | (2025.01) |
| H10D 64/01 | (2025.01) |
| H10D 84/01 | (2025.01) |
| H10D 84/03 | (2025.01) |

(52) U.S. Cl.
CPC ....... *H10D 84/83* (2025.01); *H01L 21/02603* (2013.01); *H10D 30/014* (2025.01); *H10D 30/031* (2025.01); *H10D 30/43* (2025.01); *H10D 30/6729* (2025.01); *H10D 30/6735* (2025.01); *H10D 30/6757* (2025.01); *H10D 62/121* (2025.01); *H10D 64/01* (2025.01); *H10D 64/017* (2025.01); *H10D 84/0128* (2025.01); *H10D 84/013* (2025.01); *H10D 84/0149* (2025.01); *H10D 84/0151* (2025.01); *H10D 84/038* (2025.01)

(58) Field of Classification Search
CPC .. H10D 84/83; H10D 84/038; H10D 84/0151; H10D 30/6735; H10D 30/673; H01L 21/02603
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |

(Continued)

*Primary Examiner* — Wasiul Haider
(74) *Attorney, Agent, or Firm* — JCIPRNET

(57) ABSTRACT

A semiconductor device includes a plurality of stacks that each includes a plurality of nanostructures stacked over each other, a gate structure wrapping around the nanostructures and extending between the stacks, source and drain structures, and a plurality of fin structures respectively disposed on the stacks. A first surface of the gate structure between the stacks is substantially coplanar with first surfaces of the fin structures facing to the nanostructures or between the first surfaces of the fin structures and the nanostructures.

20 Claims, 36 Drawing Sheets

(56) References Cited

U.S. PATENT DOCUMENTS

| | | |
|---|---|---|
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2016/0293699 A1* | 10/2016 | Leobandung ..... H01L 21/02381 |
| 2022/0392896 A1* | 12/2022 | Guler ................... H10D 84/038 |

* cited by examiner

FINS DISPOSED ON STACKS OF NANOSTRUCTURES WHERE THE NANOSTRUCTURES ARE WRAPPED AROUND BY A GATE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
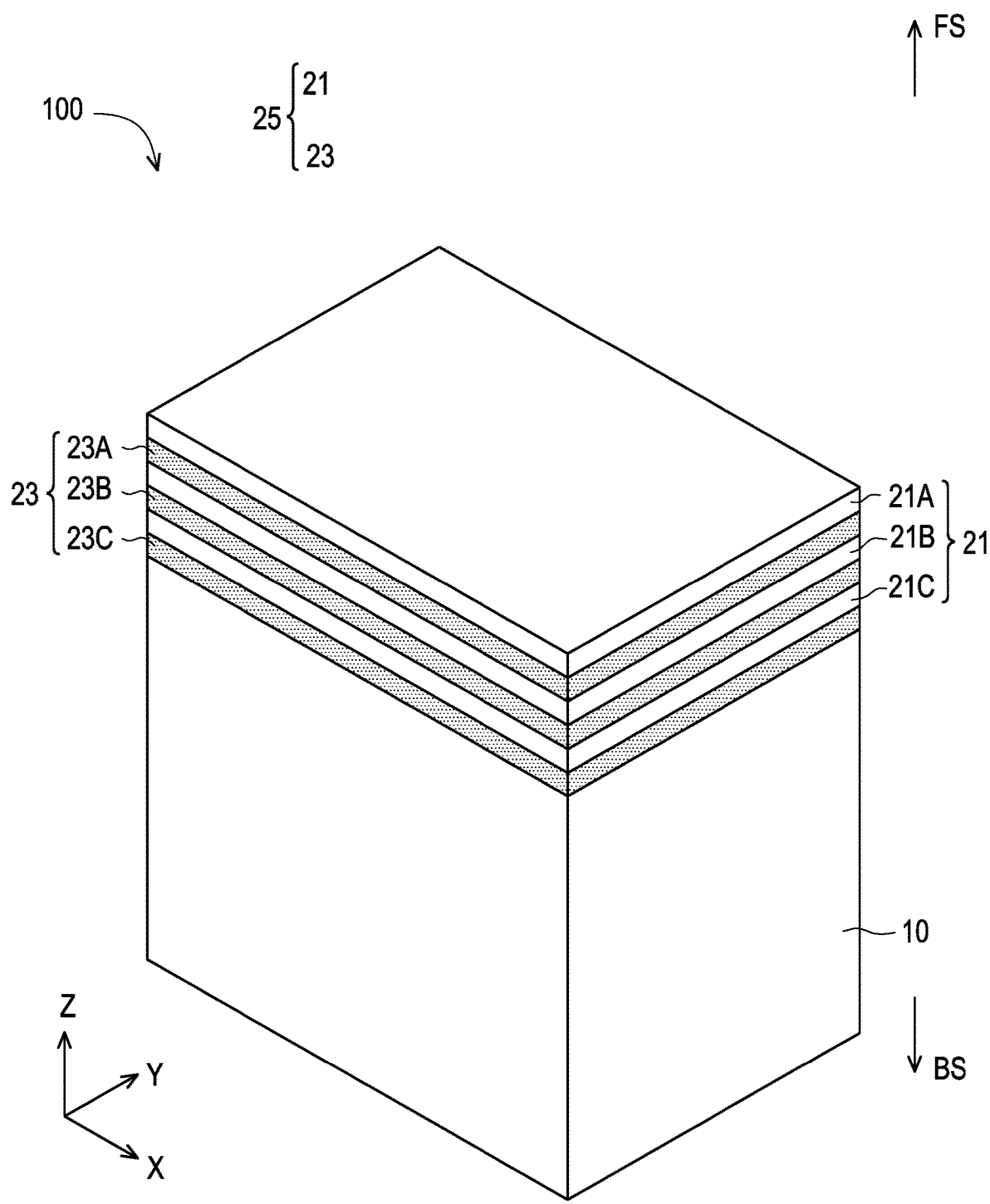
FIG. 1 through FIG. 33 are schematic perspective views and cross-sectional views at various stages in the formation a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description. Source/drain structure(s) may refer to a source or a drain, individually or collectively dependent upon the context.

Embodiments of the present disclosure provide semiconductor devices having etched-back gate structures, and methods for forming such semiconductor devices. The etch back process for the gate structure are performed at the back-side (e.g., the substrate side) of the semiconductor device, and thus the process can be referred to a "back-side gate etch back" process. The back-side gate etch back process is performed to etch away excess material of the gate structure (e.g., extruded portion of the gate structure) such that the coupling capacitance between the extruded portion of the gate structure and the adjacent source/drain contact feature is reduced. Generally, the "gate extrusion" may occur due to the unwanted Shallow Trench Isolation (STI) oxide loss through the formations of the source/drain structure and the gate structure.

In addition, although some embodiments described in this disclosure are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The various aspects of the present disclosure will now be described in more detail with reference to the figures. FIG. 1 through FIG. 33 are schematic perspective views and cross-sectional views at various stages in the formation a semiconductor device 100 in accordance with some embodiments of the disclosure. It is understood that additional operations can be provided before, during, and after processes shown by FIG. 1 through FIG. 33, and some of the operations described below can be replaced or eliminated, for additional embodiments of the method. The order of the operations/processes may be interchangeable.

Referring to FIG. 1, a substrate 10 is provided. The substrate 10 may be a semiconductor substrate, such as a bulk semiconductor, or the like, which may be doped (e.g., with a p-type or an n-type dopant) or undoped. In some embodiments, the semiconductor material of the substrate 10 includes silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

As shown in FIG. 1, a multi-layer stack 25 or "lattice" is formed over the substrate 10. The multi-layer stack 25 includes alternating layers of first semiconductor layers 21A-21C (collectively referred to as first semiconductor layers 21) and second semiconductor layers 23A-23C (collectively referred to as second semiconductor layers 23). In some embodiments, the first semiconductor layers 21 are formed of a first semiconductor material suitable for n-type nano-FETs, such as silicon, silicon carbide, or the like, and the second semiconductor layers 23 are formed of a second semiconductor material suitable for p-type nano-FETs, such as silicon germanium, or the like. In some embodiments, each layer of the multi-layer stack 25 is epitaxially grown using a process, such as a chemical vapor deposition (CVD), an atomic layer deposition (ALD), a vapor phase epitaxy (VPE), a molecular beam epitaxy (MBE), or the like.

The first semiconductor layers 21 and the second semiconductor layers 23 are respectively shown with three layers in FIG. 1. However, it is understood that the multi-layer stack 25 may include less or more layers of the first semiconductor layers 21 and the second semiconductor layers 23. Although the multi-layer stack 25 is illustrated as including a second semiconductor layer 23C as the bottommost layer, the bottommost layer of the multi-layer stack 25 may be a first semiconductor layer 21. Additionally, the semiconductor device 100 may include a front-side FS and a back-side BS opposite to the front-side FS. In the disclosure, the front-side FS of the semiconductor device 100 may refer to the side where the first semiconductor layers 21 and the second semiconductor layers 23 are formed. In some embodiments, the back-side BS of the semiconductor device 100 may also be referred to as "substrate-side".

In some embodiments, the first semiconductor material of the first semiconductor layers 21 are selected to have high etch selectivity relative to the second semiconductor material of the second semiconductor layers 23. Thus, the second semiconductor layers 23 can be removed without significantly removing the first semiconductor layers 21, thereby allowing the first semiconductor layers 21 to be patterned to form channel regions of nano-FETs. Alternatively, the first semiconductor layers 21 may be removed and the second semiconductor layers 23 may be patterned to form channel regions.

Figure 2:
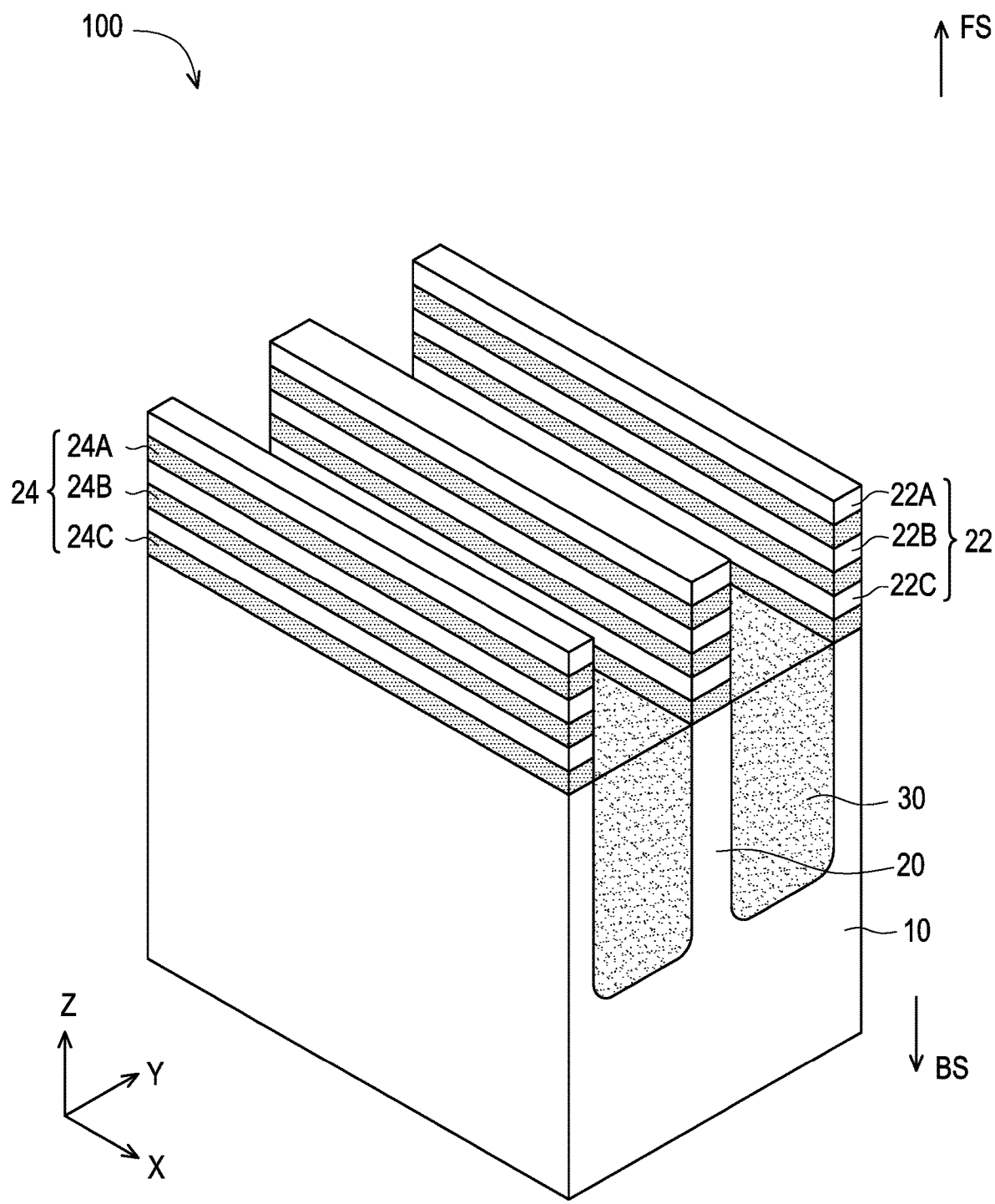

Referring to FIG. 2, fins 20 are formed in the substrate 10 and nanostructures 22, 24 are formed in the multi-layer stack 25. In some embodiments, the multi-layer stack 25 and the substrate 10 are patterned by one or more photolithography processes (e.g., double-patterning or multi-patterning processes), followed by performing an anisotropic etching process to form the fins 20 and the nanostructures 22, 24. The etching process may include a reactive ion etch (RIE), a neutral beam etch (NBE), the like, or a combination thereof. For example, first nanostructures 22A-22C (also referred to as "channels" below) are formed from the first semiconductor layers 21, and second nanostructures 24A-24C are formed from the second semiconductor layers 23. In FIG. 2, the nanostructures 22, 24 are shown with rectangular cross-sectional shape having substantially vertical sidewalls. However, it is understood that the nanostructures 22, 24 include tapered sidewalls, in accordance with some embodiments.

Further, as shown in FIG. 2, isolation regions 30, which may be shallow trench isolation (STI) regions, are formed adjacent to the fins 20. In some embodiments, the isolation regions 30 are formed by depositing an insulation material over the substrate 10, the fins 20, and the nanostructures 22, 24, and between adjacent fins 20 and between adjacent nanostructures 22, 24. The insulation material may include an oxide, such as silicon oxide, a nitride, the like, or a combination thereof, and may be deposited using a high-density plasma CVD (HDP-CVD) process, a flowable CVD (FCVD) process, the like, or a combination thereof. In some embodiments, a liner (not shown) is first formed along surfaces of the substrate 10, the fins 20, and the nanostructures 22, 24. Thereafter, a fill material, such as those discussed above is formed over the liner.

The insulation material further undergoes a removal process, such as a chemical mechanical polish (CMP), an etch back process, a combination thereof, or the like, to remove excess insulation material over the nanostructures 22, 24. Top surfaces of the nanostructures 22, 24 may be exposed and level with the insulation material after the removal process is complete. The insulation material is then recessed to form the isolation regions 30. In some embodiments, the insulation material is recessed by an acceptable etching process, such as an oxide removal process using, for example, dilute hydrofluoric acid (dHF). After recessing, the nanostructures 22, 24 and upper portions of the fins 20 may protrude from between neighboring isolation regions 30. The isolation regions 30 may include top surfaces that are flat as illustrated, convex, concave, or a combination thereof.

Still referring to FIG. 2, appropriate wells (not shown) may be formed in the fins 20, the nanostructures 22, 24, and/or the isolation regions 30. For example, an n-type impurity implantation is performed in p-type regions of the substrate 10, and a p-type impurity implantation is performed in n-type regions of the substrate 10. An anneal process may be performed after the implantations to repair implant damage and to activate the p-type and/or n-type impurities.

Figure 3:
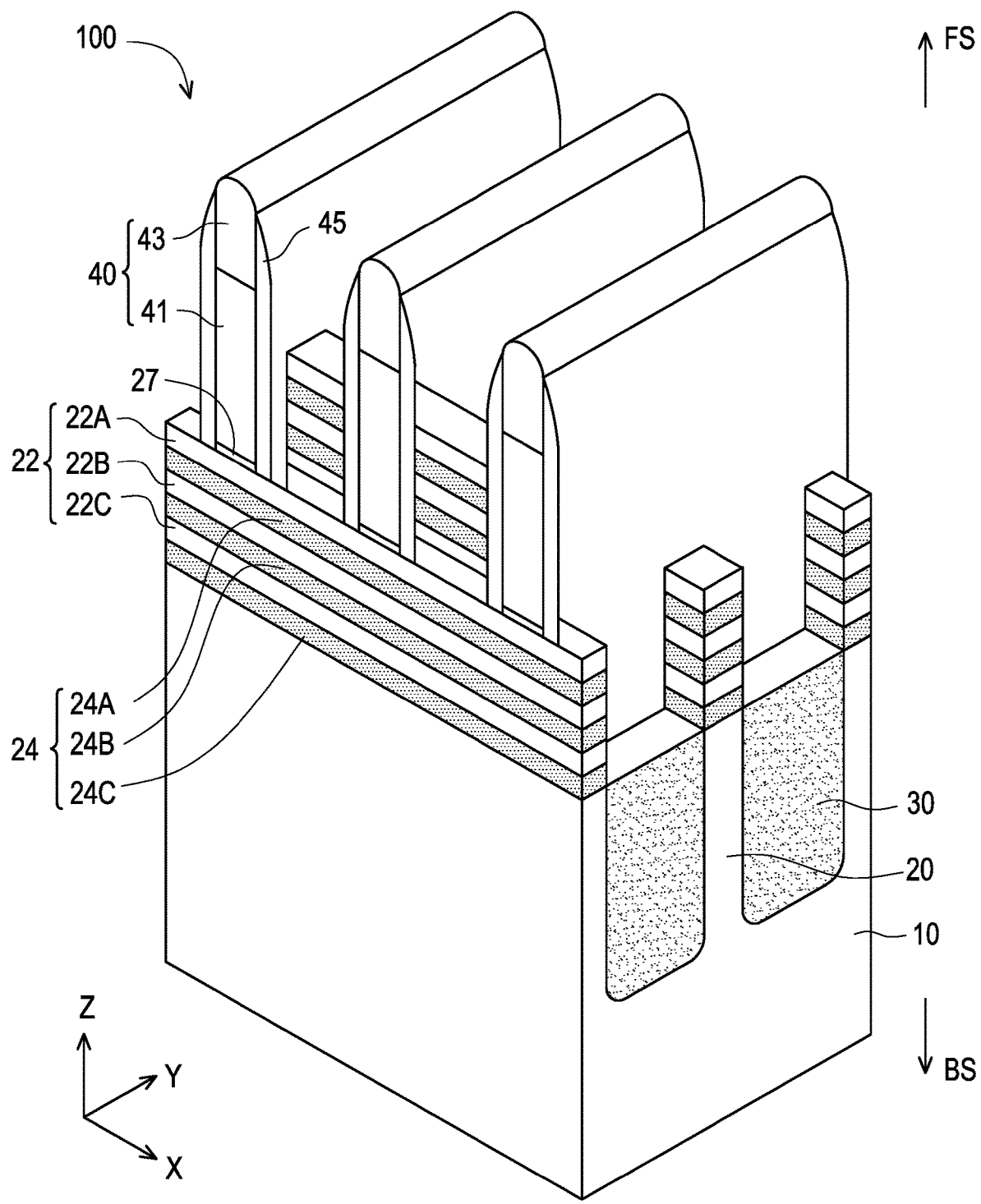

Referring to FIG. 3, a dielectric layer 27 is formed over the nanostructures 22, 24 and the isolation regions 30, and a plurality of dummy gate structures 40 are formed on the dielectric layer 27 over the nanostructures 22, 24. Each dummy gate structure 40 may include a dummy gate layer 41 and a mask layer 43 over the dummy gate layer 41. For example, the dielectric layer 27 is formed using a suitable deposition technique (such as a CVD process, a sub-atmospheric CVD (SACVD) process, an ALD process) to conformally cover top surfaces of the nanostructures 22, 24 and the isolation regions 30. In some embodiments, the dielectric layer 27 includes silicon oxide, silicon nitride, high-K dielectric material and/or other suitable material.

Thereafter, a dummy gate material layer is deposited on the dielectric layer 27 over the nanostructures 22, 24 and the isolation regions 30, in accordance with some embodiments. The dummy gate material layer may include conductive, semi-conductive, or non-conductive material. For example, the dummy gate material layer includes amorphous silicon, polycrystalline-silicon (polysilicon), poly-crystalline silicon-germanium (poly-SiGe), metallic nitrides, metallic silicides, metallic oxides, or metals. A mask material layer may be formed over the dummy gate material layer, and may include silicon nitride, silicon oxynitride, or the like. In some embodiments, the dummy gate material layer and the mask material layer are formed by physical vapor deposition (PVD), CVD, sputter deposition, or other suitable techniques.

The dummy gate material layer and the mask material layer are then patterned to form a plurality of discrete (i.e., separate) dummy gate structures 40 each including a dummy gate layer 41 and a mask layer 43, in accordance with some embodiments. Next, spacers 45 may be formed on sidewalls of each dummy gate structure 40 (i.e., sidewalls of the dummy gate layer 41 and the mask layer 43). The spacers 45 are, for example, made of an insulation material, such as silicon nitride, silicon oxide, silicon carbo-nitride, silicon oxynitride, silicon oxy carbo-nitride, or the like. The spacers 45 may be formed by depositing a spacer material layer (not shown) over the dummy gate structures 40. Portions of the spacer material layer are removed using an anisotropic etching process, leaving the spacers 45 on sidewalls of each dummy gate structure 40, in accordance with some embodiments.

Figure 4:
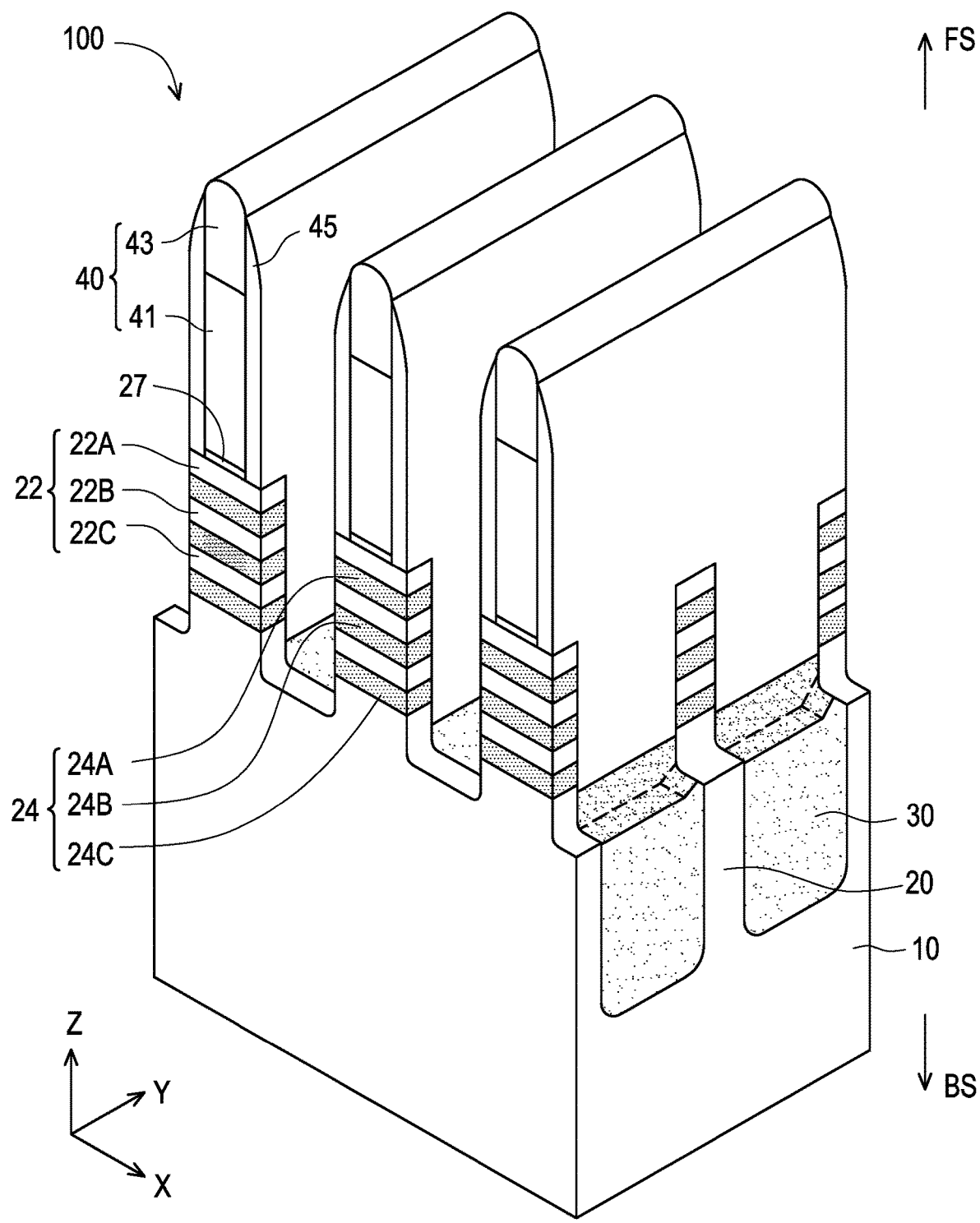

Referring to FIG. 4, an etching process is performed to etch the portions of protruding fins 20 and/or nanostructures 22, 24 that are not covered by dummy gate structures 40 and the spacers 45, and the resulting structure is as shown in FIG. 4. The etching process may be anisotropic, such that the portions of fins 20 directly underlying the dummy gate structures 40 and the spacers 45 are protected, and are not etched. Due to the etch selectivity, the isolation regions 30 may be etched more, such that top surfaces of the recessed isolation regions 30 are lower than top surfaces of the recessed fins 20, as illustrated in FIG. 4.

Figure 5:
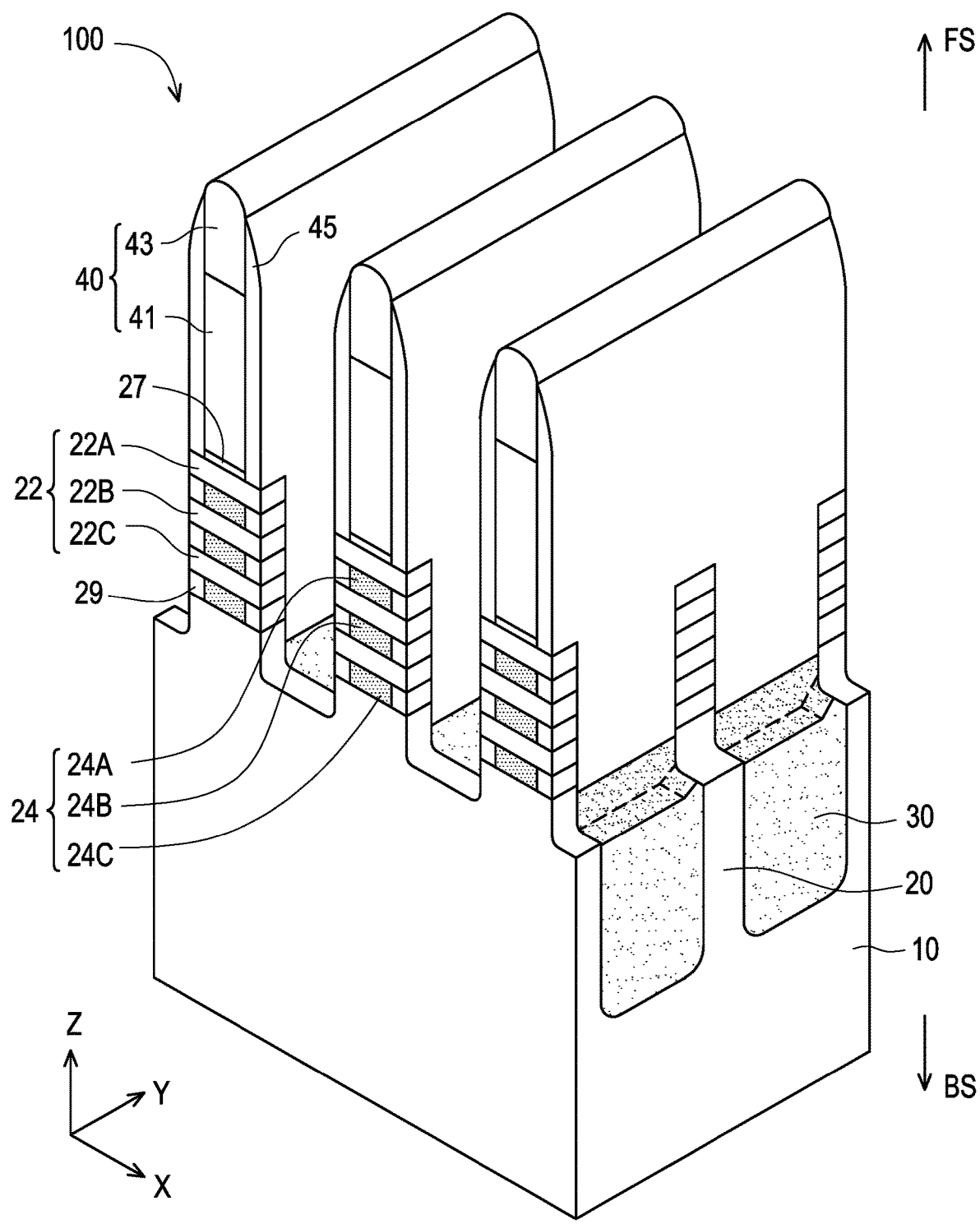

Referring to FIG. 5, inner spacers 29 are formed on sidewalls of the nanostructures 24. For example, a selective etching process is performed to recess end portions of the nanostructures 24 (e.g., end portions of each nanostructure 24A-24C) without removing the nanostructures 22. After the selective etching process, recesses (not shown) that formed at the sidewalls of the nanostructures 24 may be filled with suitable dielectric material to form inner spacers 29. For example, the inner spacers 29 are formed through forming an inner spacer layer using a suitable deposition technique such as PVD, CVD, ALD, or the like, followed by performing an anisotropic etching process to remove portions of the inner spacer layer outside the recesses in the nanostructures 24. The remaining portions of the inner spacer layer (e.g., portions disposed inside the recesses in the nanostructures 24) form the inner spacers 29, for example. In some embodiments, the inner spacers 29 include silicon nitride (SiN), silicon oxycarbide (SiOC), silicon carbon nitride (SiCN), silicon oxycarbonitride (SiOCN), or the like. In some embodiments, outer sidewalls of the spacers 29 are substantially flush with outer sidewalls of the nanostructures 22 and outer sidewalls of the spacers 45.

Figure 6:
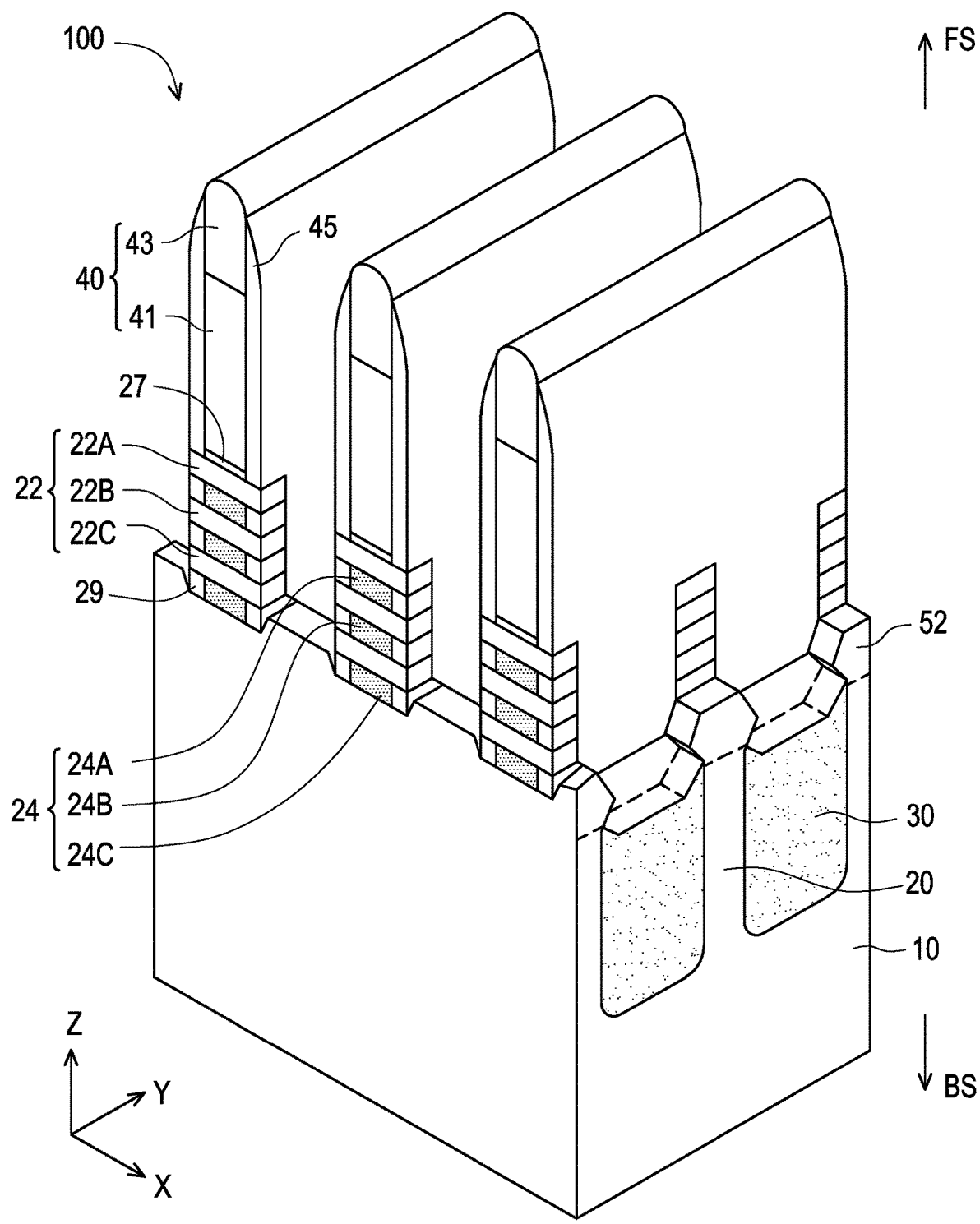

Referring to FIG. 6, elevated epitaxial structures 52 are formed over the recessed fins 20. For example, a bottom-up growth process is performed on exposed surfaces of the recessed fins 20 to epitaxially grow the elevated epitaxial structures 52. Generally, the elevated epitaxial structures 52 may include a bottom-up growth profile, due to the differences in growth rates in different directions. As shown in FIG. 6, the elevated epitaxial structures 52 may be formed in a hexagonal shape from cross-sectional view. However, the bottom-up growth profiles of the elevated epitaxial structures 52 may include any suitable cross-sectional shapes, such as a circular shape, a square shape, or a diamond shape. In some embodiments, the elevated epitaxial structures 52 is formed of a material similar to, or the same as, those of the recessed fin 20 (e.g., material of the substrate 10), such as silicon.

Figure 7:
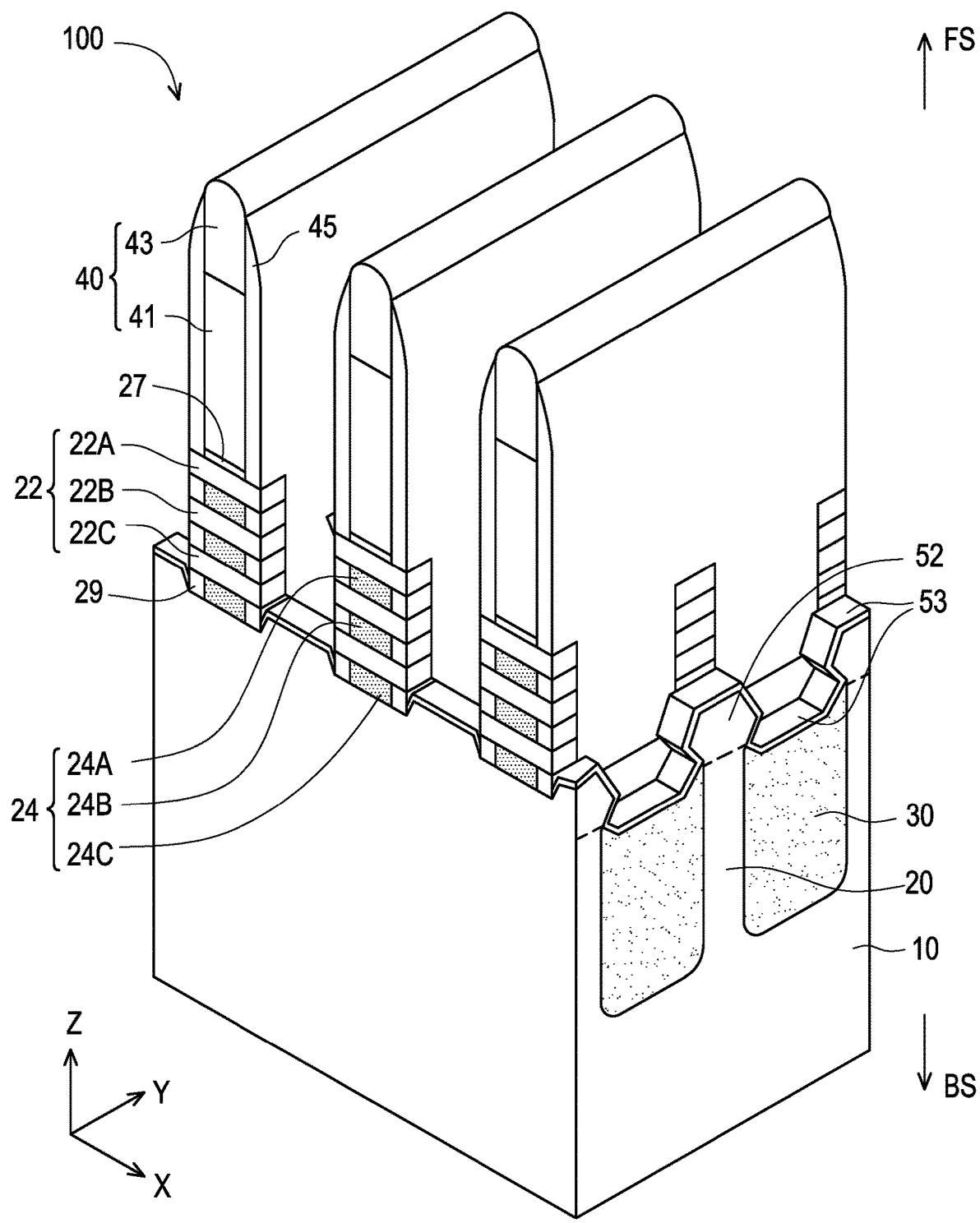

Referring to FIG. 7, a dielectric layer 53 is formed conformally covering the exposed surfaces of the elevated epitaxial structures 52 and the recessed isolation regions 30. In some embodiments, the dielectric layer 53 is formed of oxides, such as silicon oxide (SiO), aluminum oxide (AlO), zirconium oxide (ZrO), hafnium oxide (HfO), titanium oxide (TiO), zirconium aluminum oxide (ZrAlO), zinc oxide (ZnO); nitrides, such as silicon nitride (SiN); oxynitrides, such as aluminum oxynitride (AlON); SiCN, SiOCN; or the like. The dielectric layer 53 may be formed by CVD, PECVD, ALD, or any suitable deposition technique. In one embodiment, the dielectric layer 53 is formed to have a thickness ranging from about 1 nm to about 10 nm.

Figure 8:
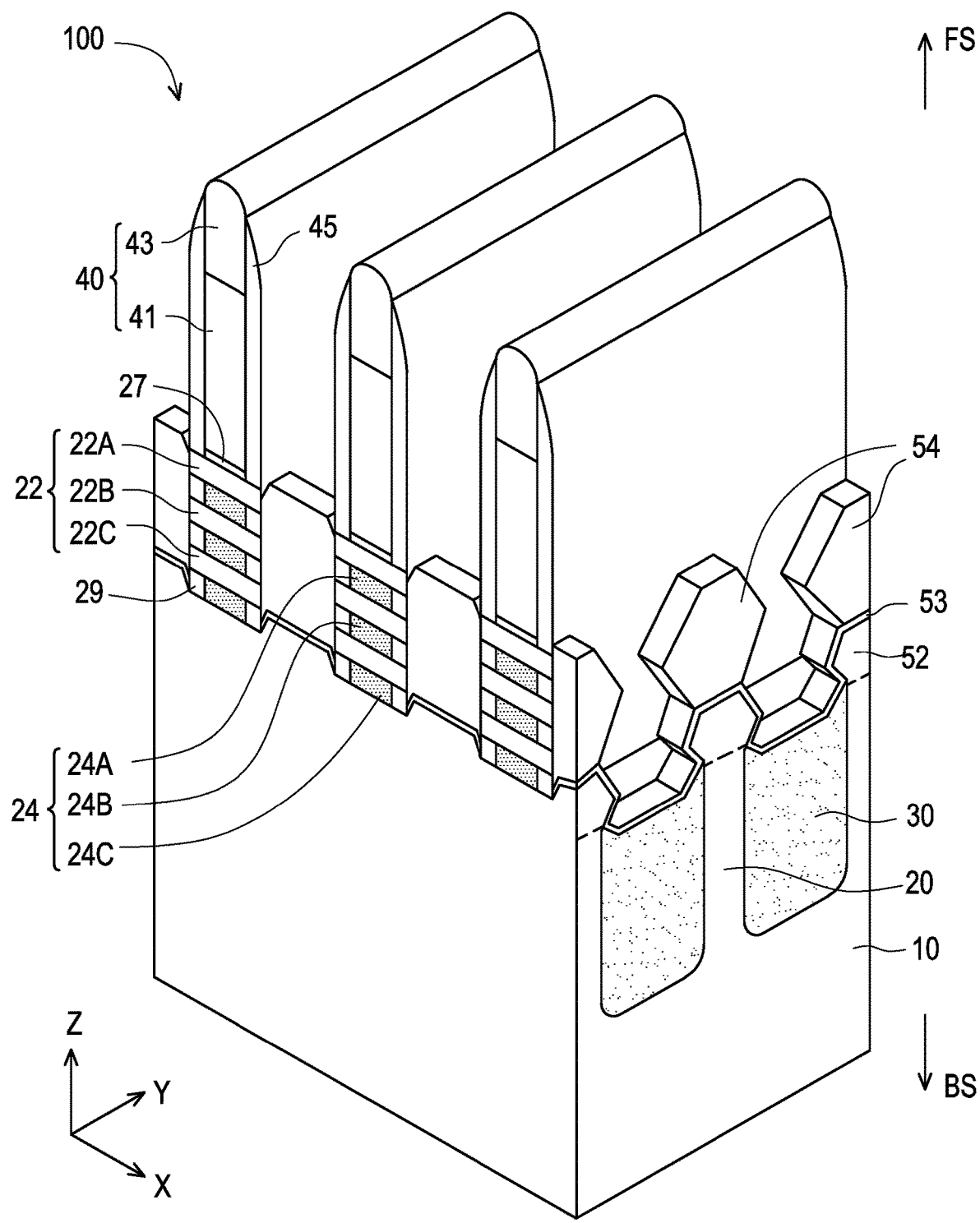

Referring to FIG. 8, source/drain structures 54 are formed over the elevated epitaxial structures 52. In some embodiments, the source/drain structures 54 are formed by an epitaxial growth process and include an angled, curved or irregular profile. For example, the source/drain structures 54 are illustrated with a hexagonal-shaped profile in FIG. 8. In some embodiments, the source/drain structures 54 exert stress in the respective channels 22A-22C, thereby improving performance. The source/drain structures 54 are formed such that each dummy gate structure 40 is disposed between respective neighboring pairs of the source/drain structures 54. In addition, the spacers 45 separates the source/drain structures 54 from the dummy gate layer 41 by an appropriate lateral distance to prevent electrical bridging to subsequently formed metal gate structures, for example.

The source/drain structures 54 may include any acceptable material, such as appropriate for n-type or p-type devices. For n-type devices, the source/drain structures 54 include materials exerting a tensile strain in the channel regions, such as silicon, SiC, SiCP, SiP, or the like, in some embodiments. When p-type devices are formed, the source/drain structures 54 include materials exerting a compressive strain in the channel regions, such as SiGe, SiGeB, Ge, GeSn, or the like, according to some embodiments. Alternatively, neighboring source/drain structures 54 may merge to form a singular source/drain region adjacent two or more neighboring nanostructures 22, 24. Further, in some embodiments, the source/drain structures 54 are implanted with dopants followed by an anneal process. In some embodiments, the source/drain structures 54 are in situ doped during growth.

Figure 9:
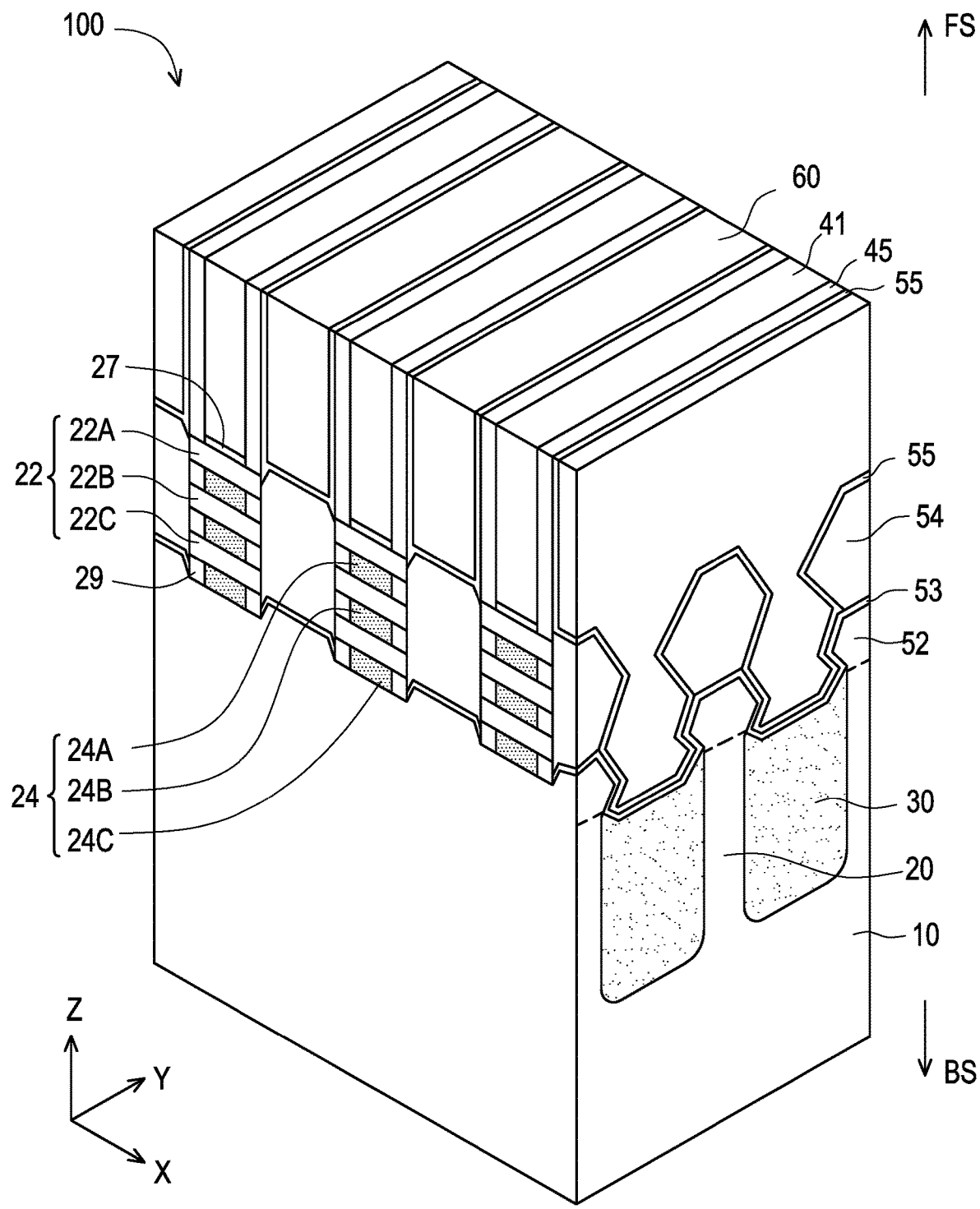

Referring to FIG. 9, a contact etch stop layer (CESL) 55 and an interlayer dielectric (ILD) layer 60 are formed to cover the dummy gate structures 40 and the source/drain structures 54. For example, the CESL 55 is conformally formed on the exposed surfaces of the semiconductor device 100 shown in FIG. 8. The CESL 55 covers the sidewalls of the spacers 45 and the exposed surfaces of the mask layer 43, source/drain structure 54 and the dielectric layer 53. In some embodiments, the CESL 55 includes an oxygen-containing material such as silicon oxide and silicon carbon oxide or a nitrogen-containing material such as silicon nitride, silicon carbon nitride, silicon oxynitride and carbon nitride, or a combination thereof, and is formed by CVD, PECVD, ALD, or any suitable deposition technique.

Next, the ILD layer 60 is formed on the CESL 55 over the semiconductor device 100, such that the spaces between the dummy gate structures 40 are filled by the ILD layer 60. In some embodiments, the materials for the ILD layer 60 include compounds comprising Si, 0, C, and/or H, such as silicon oxide, TEOS oxide, SiCOH and SiOC. Organic materials, such as polymers, may also be used for the ILD layer 60. The ILD layer 60 may be deposited by a PECVD process or other suitable deposition technique. In some embodiments, after the formation of the ILD layer 60, the semiconductor device 100 is subject to a thermal process to anneal the ILD layer 60. Further, a planarization process, such as a CMP, may be performed on the semiconductor device 100 until the dummy gate layers 41 are exposed. In some embodiments, during the planarization process, the mask layer 43 is entirely removed while the ILD layer 60, the CESL 55, the dummy gate layers 41 and the spacers 45 are partially removed. After the planarization process, the top surfaces of the dummy gate layers 41, the spacers 45, the ILD layer 60 and the CESL 55 may be substantially coplanar.

Figure 10:
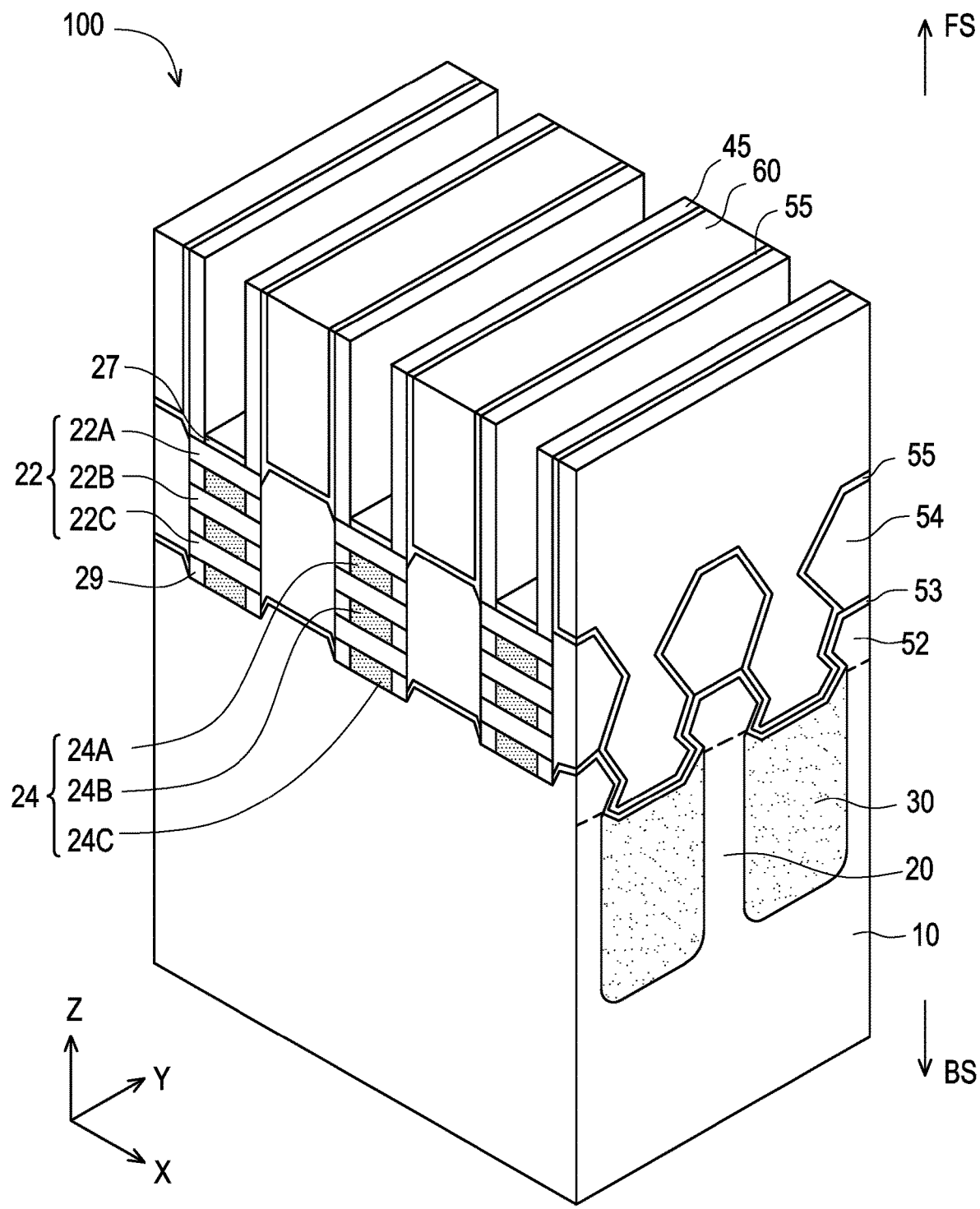
Figure 11:
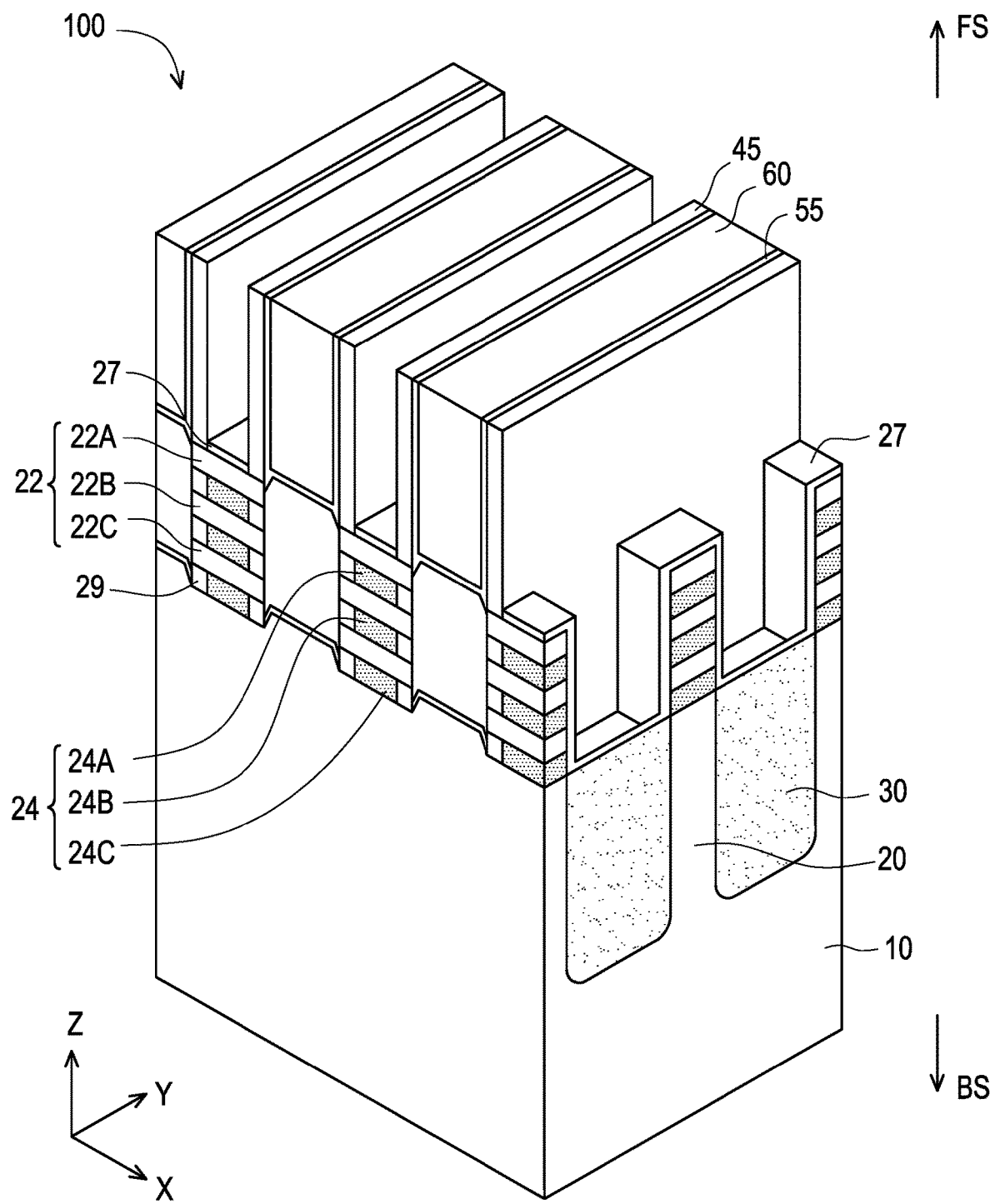

Referring to FIG. 10 and FIG. 11 together, the dummy gate layers 41 are removed from the semiconductor device 100. For the clarity of discussion, FIG. 10 and FIG. 11 respectively show different perspective views of the semiconductor device 100 after the dummy gate layers 41 are removed. For example, the rightmost side of the perspective view of FIG. 10 shows the cross-section of the source/drain structures 54, while rightmost side of the perspective view of FIG. 11 shows the cross-section of the nanostructures 22, 24. The dummy gate layers 41 may be removed using dry etching and/or wet etching. For example, in cases where the dummy gate layers 41 are polysilicon and the ILD layer 60 is silicon oxide, a wet etchant, such as a tetramethylammonium hydroxide (TMAH) solution is used to selectively remove the dummy gate layers 41 without removing the dielectric materials of the ILD layer 60, the CESL 55, the spacers 45, and the dielectric layer 27. As shown in FIG. 10, the source/drain structures 54 may be protected by the ILD layer 60 and the CESL 55 during the removal of the dummy gate layers 41. On the other hand, as shown in FIG. 11, after the dummy gate layers 41 are removed, the dielectric layer 27 conformally formed on the nanostructures 22, 24 may be exposed.

Figure 12:
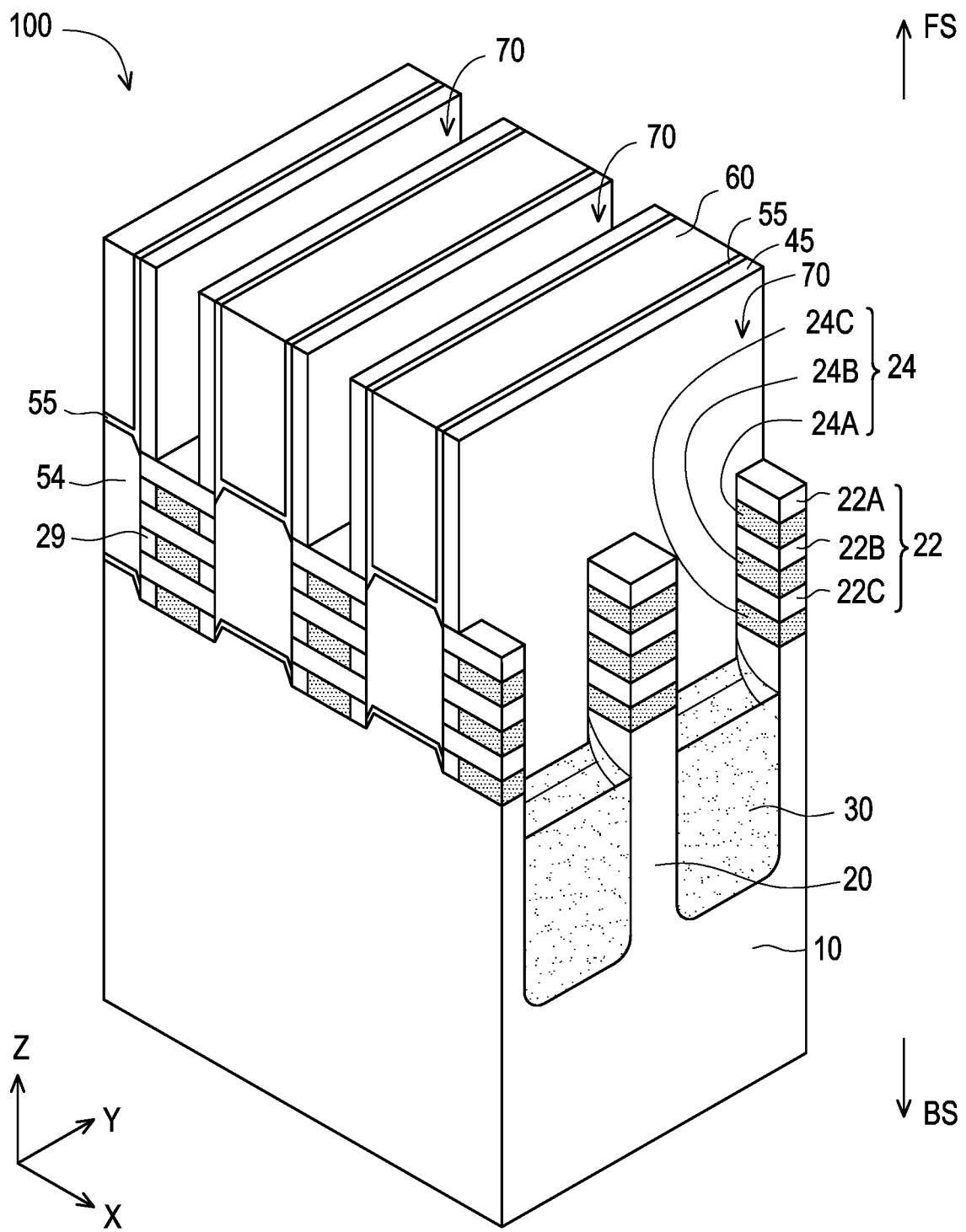

Turning to FIG. 12, the dielectric layer 27 is removed using plasma dry etching and/or wet etching, for example. As illustrated in FIG. 12, in some embodiments, the removal of the dielectric layer 27 causes damages to the insulation material of the isolation regions 30, thereby partially recessing the isolation regions 30. Further, the removal of the dummy gate layers 41 and the dielectric layer 27 together may form trenches 70 exposing the nanostructures 22, 24. For example, the trenches 70 expose surfaces of the nanostructures 22, 24 and the isolation regions 30 and the outer sidewalls of the spacers 45.

Figure 13:
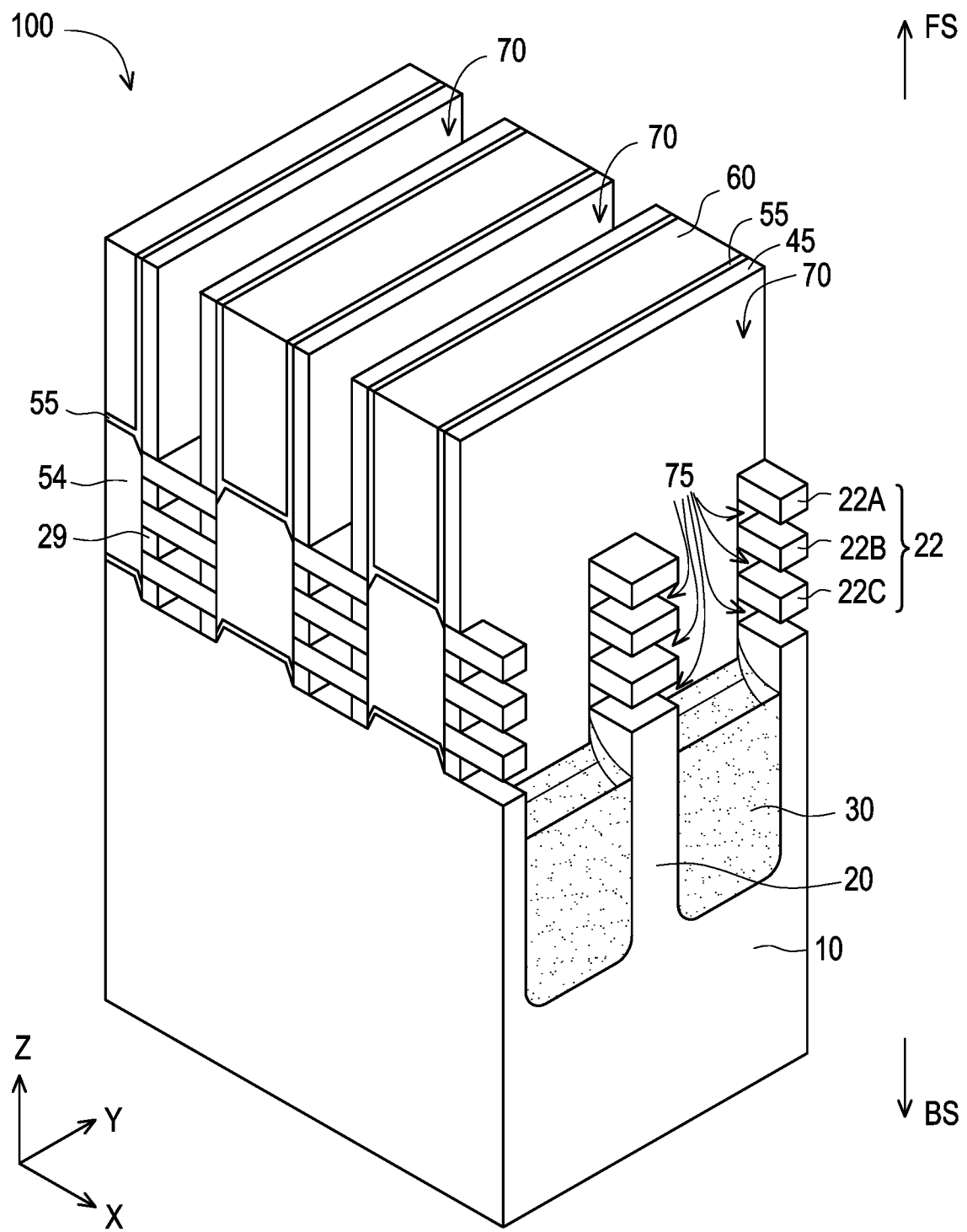

Referring to FIG. 13, the second nanostructures 24A-24C are removed from the trenches 70, leaving the first nanostructures 22A-22C. The removal of the second nanostructures 24A-24C may result in gaps 75 formed between the first nanostructures 22A-22C connecting to the source/drain structures 54. Accordingly, each of the first nanostructures 22A-22C has surfaces (e.g., top surface and bottom surface) exposed by the gaps 75, and the exposed surfaces are opposite to each other and are perpendicular to the longitudinal direction (e.g., the Z-direction). In some embodiments, the exposed surfaces will be surrounded by a gate layer later to be formed, and each of the first nanostructures 22A-22C forms a nanosheet channel of the nanosheet transistor. Further, the first nanostructures 22 may be referred to as nanostructure stacks which each include a plurality of nanostructures (e.g., first nanostructures 22A-22C) stacked over each other, in accordance with some embodiments.

The second nanostructures 24A-24C may be removed using any suitable selective removal process, such as a selective wet etching process and a selective dry etching process. In cases where the second nanostructures 24A-24C are made of SiGe or Ge and the first nanostructures 22A-22C are made of Si, the selective wet etching process removes SiGe or Ge while not substantially removing Si, the insulation material of the spacers 45, and the dielectric material of the inner spacers 29. In one embodiment, the second nanostructures 24A-24C are removed using a wet etchant such as ammonium hydroxide ($NH_4OH$), tetramethylammonium hydroxide (TMAH), ethylenediamine pyrocatechol (EDP), or potassium hydroxide (KOH) solution.

Figure 14:
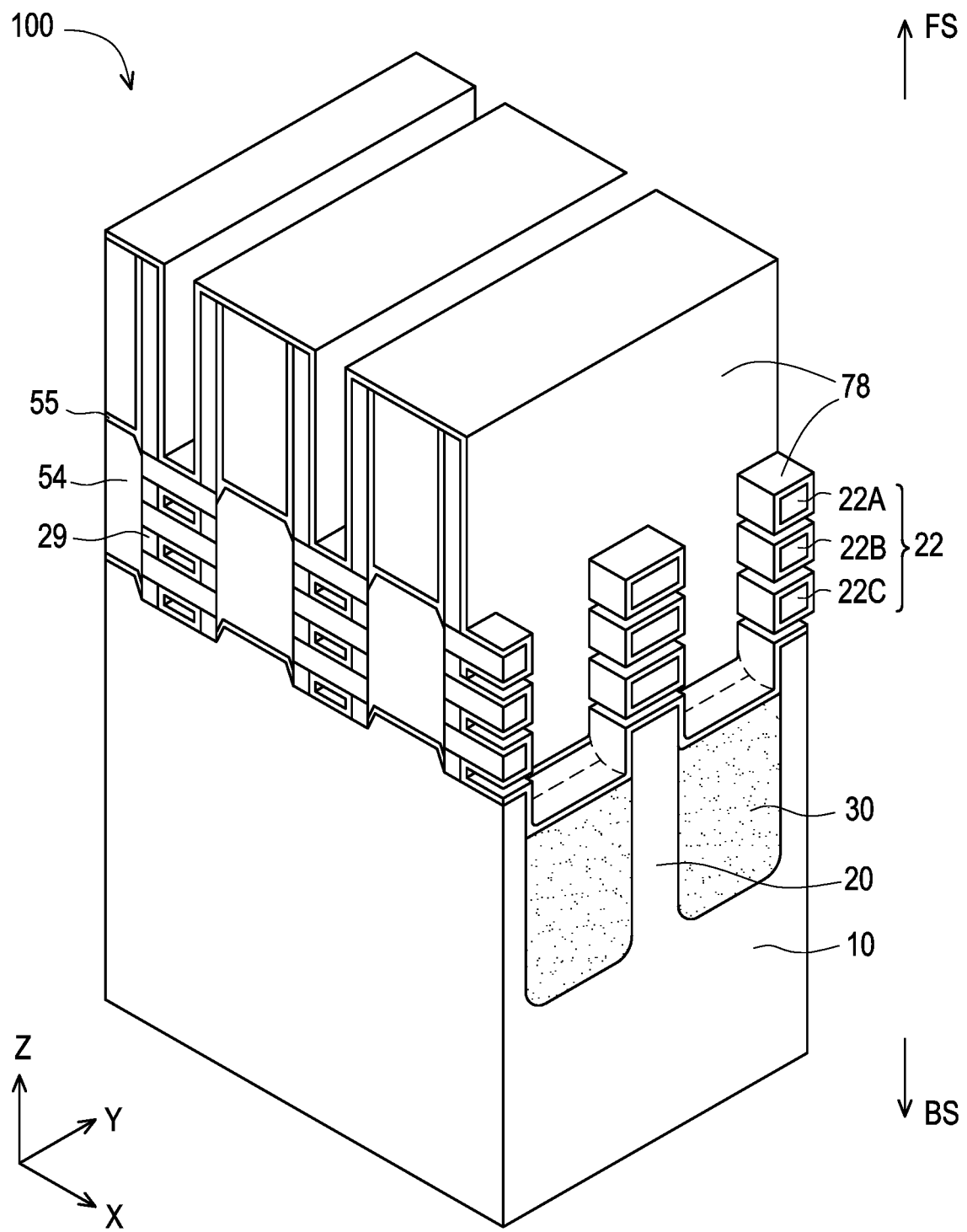

After the formation of the nanosheet channels (i.e., the first nanostructures 22A-22C), a gate dielectric layer 78 may be conformally formed on the exposed surfaces of the semiconductor device 100 shown in FIG. 13. For example, the gate dielectric layer 78 is formed to wrap around each of the first nanostructures 22A-22C and covers exposed surfaces of the isolation regions 30 and the fins 20, as shown in FIG. 14. In some embodiments, the gate dielectric layer 78 includes one or more layers of a dielectric material, such as silicon oxide, silicon nitride, high-K dielectric material, other suitable dielectric material, and/or a combination thereof. Examples of high-K dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-K dielectric materials, and/or a combination thereof. The gate dielectric layer 78 may be formed by CVD, ALD or any suitable deposition technique. In one embodiment, the gate dielectric layer 78 is formed using a conformal deposition process, such as ALD to ensure that a gate dielectric layer of uniform thickness is formed around each of the first nanostructures 22A-22C.

Figure 15:
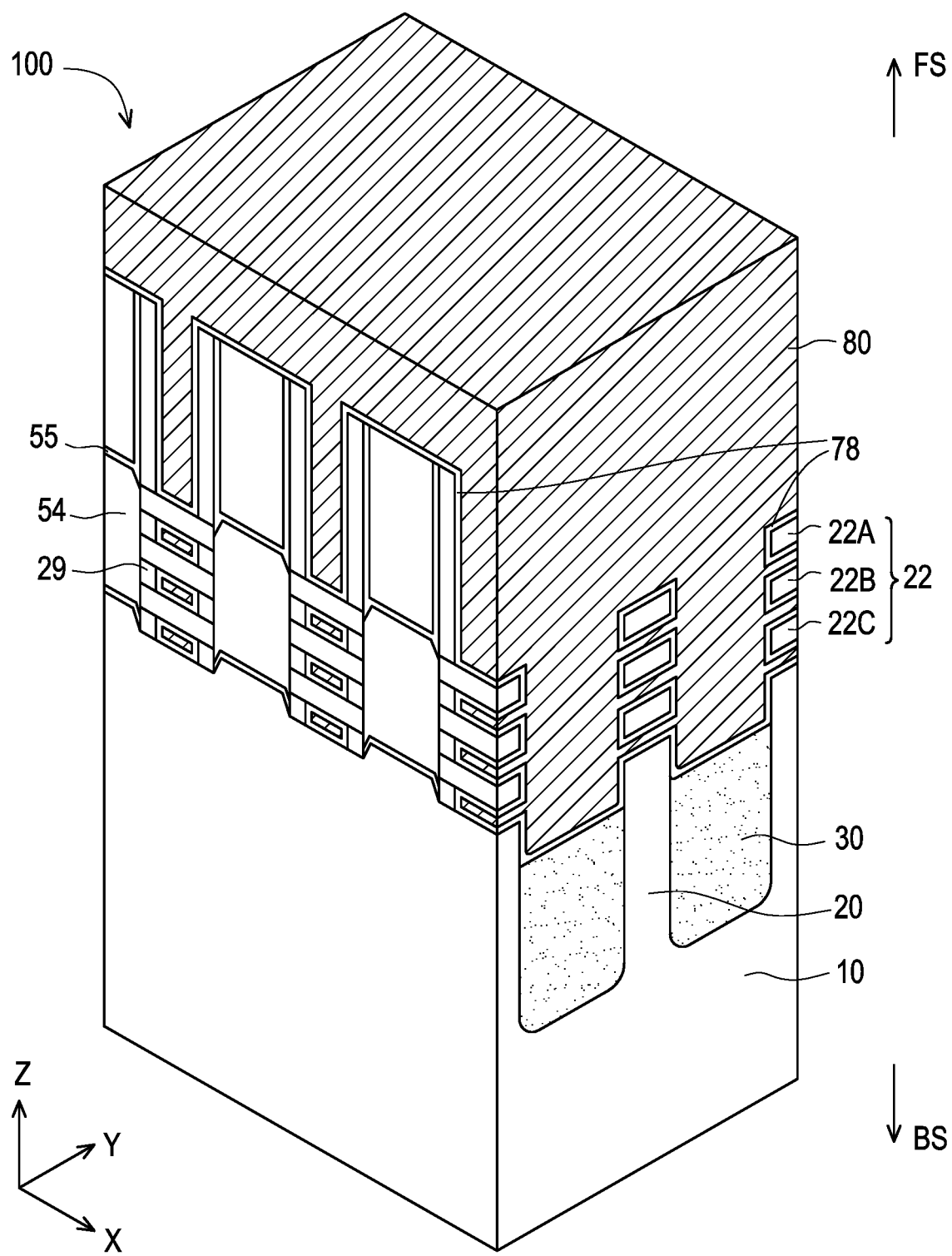

Referring to FIG. 15, a gate layer 80 is formed on the gate dielectric layer 78 to wrap around the first nanostructures 22A-22C. For example, the gate layer 80 surrounds a portion of each of the first nanostructures 22A-22C. In some embodiments, the gate layer 80 is formed to fill the trenches 70 and the gaps 75. For example, the gate layer 80 is deposited until top surfaces of the spacers 45, the CESL 55 and the ILD layer 60 are covered. In some embodiments, the gate layer 80 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or any combinations thereof. The gate layer 80 may be formed by CVD, ALD, electro-plating, or other suitable deposition technique.

Figure 16:
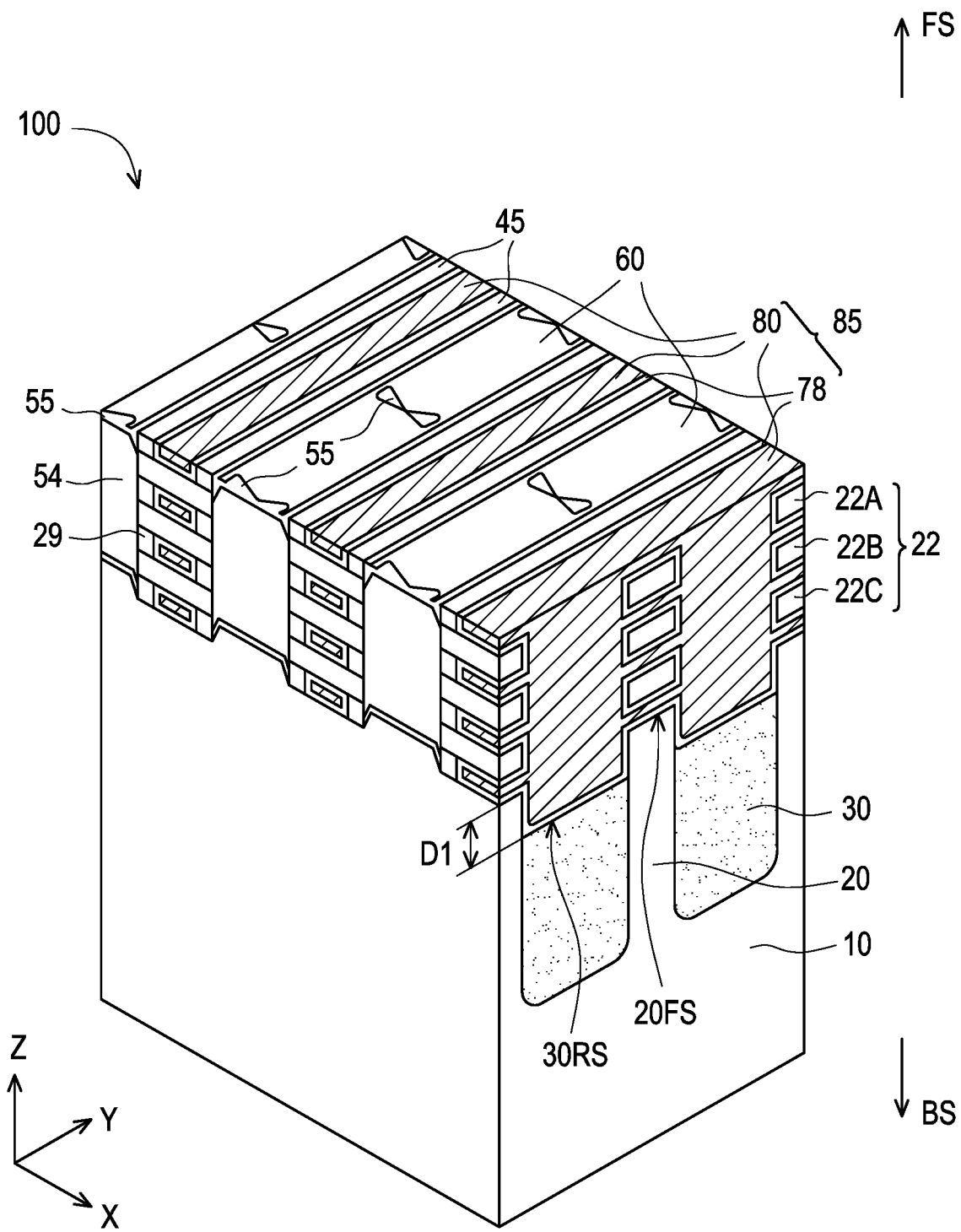

Referring to FIG. 16, the gate dielectric layer 78, the gate layer 80, the CESL 55 and the ILD layer 60 are partially removed. In some embodiments, the partial removal is performed using CMP until the top surfaces of the CESL 55 directly on the source/drain structures 54 are exposed. The remaining gate dielectric layer 78 and gate layer 80 may be collectively referred to as a gate structure 85. In some embodiments, subsequent to the partial removal process, top surfaces of the gate structures 85, the ILD layer 60, the CESL 55, and the spacers 45 are substantially coplanar with each other. In some embodiments, as shown in FIG. 16, the gate structure 85 wraps around the nanostructures 22 and extend between the adjacent nanostructure stacks (e.g., each nanostructure stack including the nanostructures 22A-22C stacked over each other).

Owing to the recessing of the isolation regions 30 during the removal of the dielectric layer 27, portions of the gate structure 85 between the adjacent nanostructures 22 may extend down (e.g., along the Z-direction) into the substrate 10 from a top surface of the substrate 10 by a vertical dimension D1, as shown in FIG. 16. The vertical dimension D1 may refer to a distance between a front-side surface 20FS of the fin 20 and a recessed surface 30RS of the isolation region 30. In some embodiments, the vertical dimension D1 is in a range between about 10 nm and about 30 nm.

The first nanostructures 22, the source/drain structures 54, and the gate structure 85 (including the gate dielectric layer 78 and the gate layer 80) may collectively be referred to as transistor structures. After the transistor structures are formed, source/drain contact structures 94 connected to the source/drain structures 54 are then formed at the front-side FS of the semiconductor device 100. The source/drain contact structures 94 may also be referred to as front-side source/drain contact structures 94. The formation of the front-side source/drain contact structures 94 will be described with reference to FIG. 17 through FIG. 19.

Figure 17:
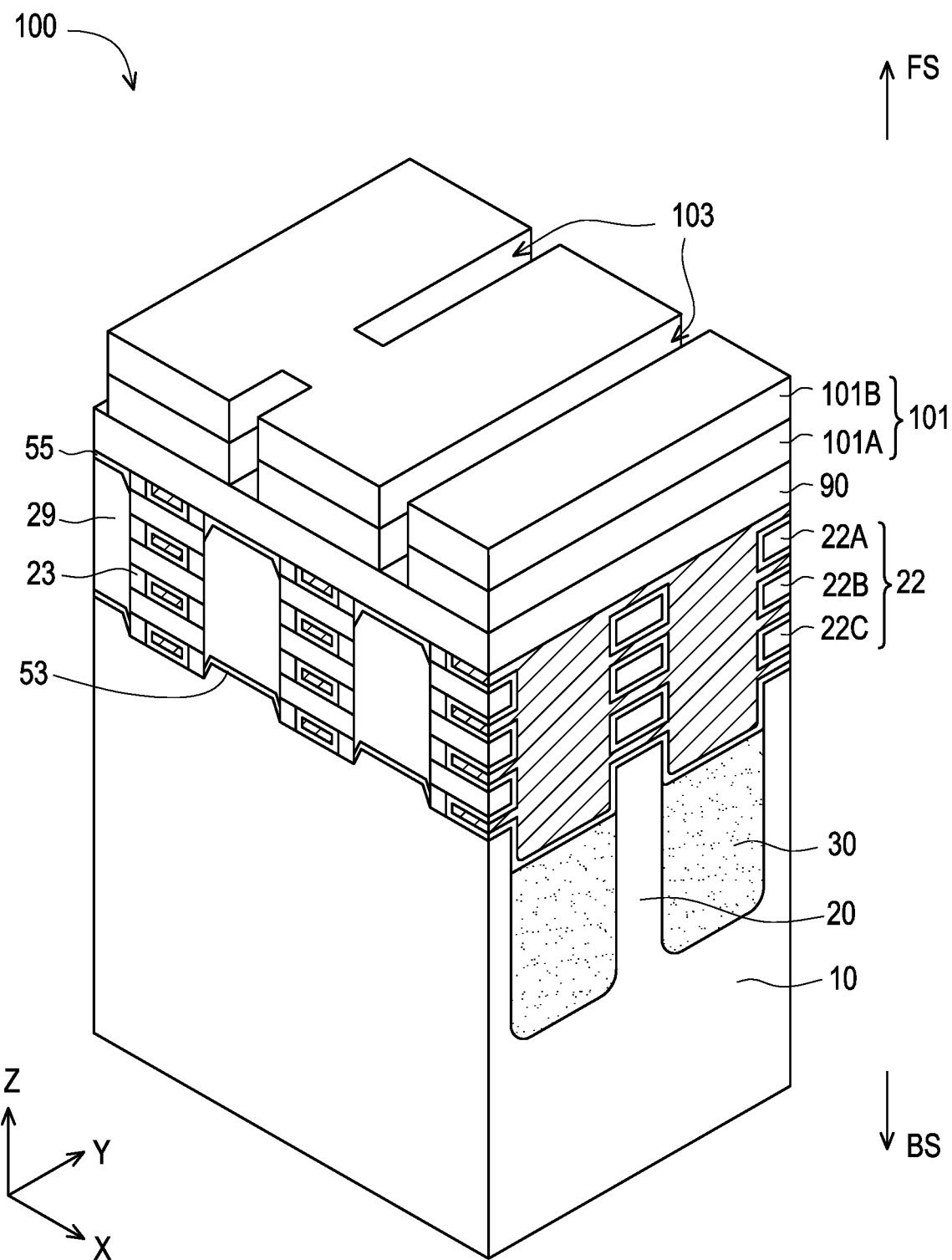

Referring to FIG. 17, a dielectric layer 90 and a photoresist stack 101 are sequentially formed over the semiconductor 100 shown in FIG. 16. In some embodiments, the dielectric layer 90 includes low-k materials, such as SiO, SiOC, AlO, AlON, ZrO, HfO, TiO, ZrAlO, ZnO, SiN, SiOCN, SiOCN, SiCN, any suitable dielectric layer material, or a combination thereof. The dielectric layer 90 may be formed using any suitable deposition process, such as CVD or PVD.

In some embodiments, the photoresist stack 101 includes multiple masking layers such as a bottom masking layer 101A and a top masking layer 101B. In some embodiments, the bottom masking layer 101A is used to reduce reflection during lithography exposing processes and provides a high etching selectivity with respect to the underlying layer (e.g., the dielectric layer 90). For example, the bottom masking layer 101A includes polymer-based material. In some embodiments, the top masking layer 101B is a layer formed of a photoresist (e.g., a photosensitive material), which includes organic materials. The top masking layer 101B may be a positive photosensitive material or a negative photosensitive material. Further, the bottom masking layer 101A and the top masking layer 101B may be deposited sequentially using, for example, spin-on process, CVD, any suitable deposition processes, or a combination thereof.

Referring to FIG. 17, the photoresist stack 101 is patterned to form a plurality of openings 103 in the photoresist stack 101. In some embodiments, the openings 103 are formed at locations above the locations that the front-side source/drain contact structures 94 will be later formed. It is understood that the arrangements of the opening 103 in FIG. 17 are merely examples, and can be changed based on design requirements. For example, depending on the circuit design, the openings 103 include line-shaped openings and/or island-shaped openings which will be transferred to the underlying layer to respectively form line-shaped trenches and/or island-shaped trenches for accommodating later-formed source/drain contact structures. In some embodiments, the source/drain contact structures formed in the line-shaped trenches are in direct contact with multiple source/drain structures and the source/drain contact structures formed in the island-shaped trenches are in direct contact with a single source/drain structure.

Figure 18:
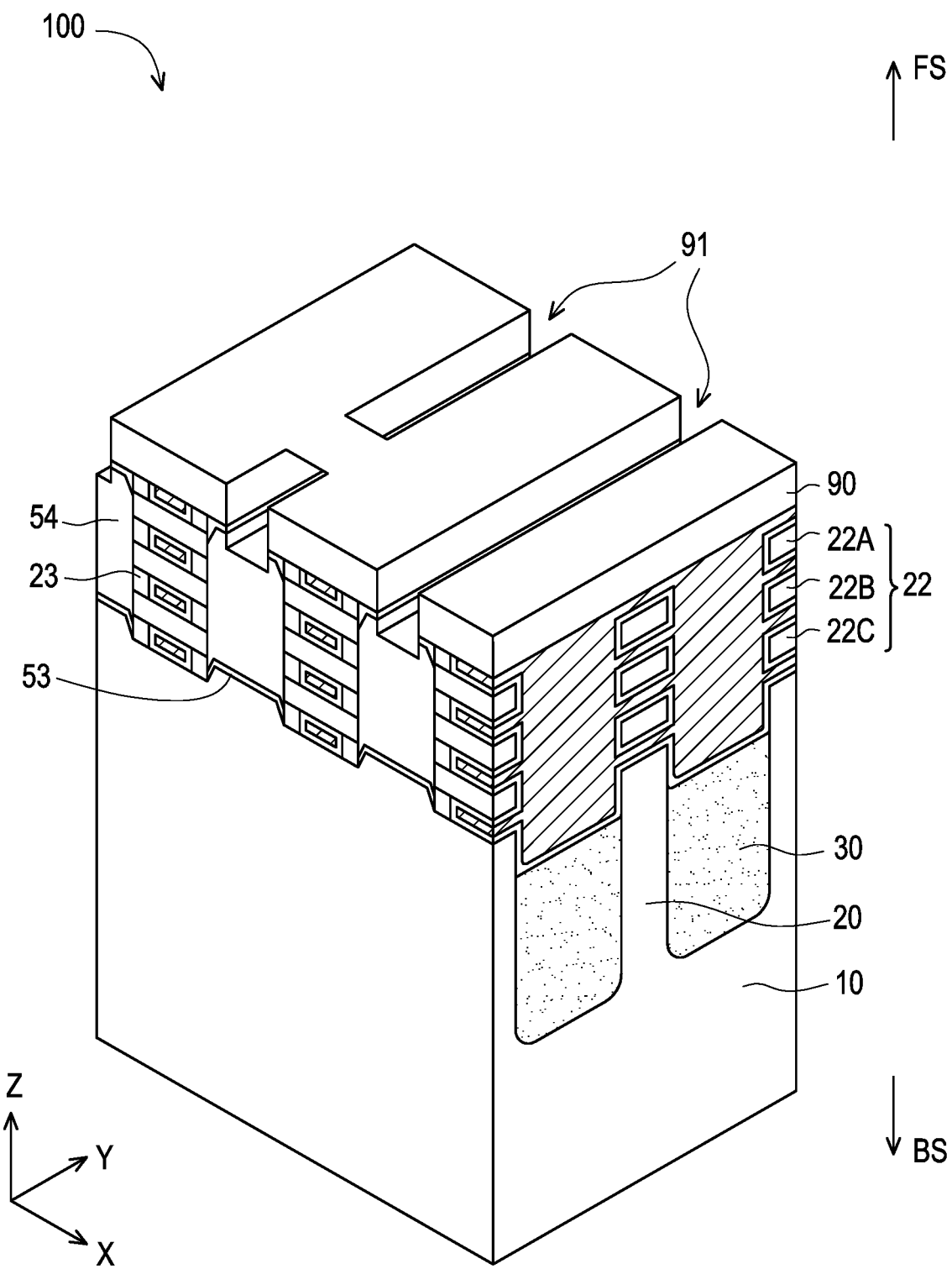

Referring to FIG. 18, the openings 103 are then transferred to the underlying layers to form trenches 91 for accommodating later-formed source/drain contact structures 94. The trenches 91 may be formed using any suitable etching process including wet etching, dry etching, reactive ion etching (RIE), and/or other suitable techniques. Thereafter, the photoresist stack 101 may be removed using, for example, a stripping process (e.g., a wet strip process) or an ashing process (e.g., plasma ashing process). In some embodiments, the trenches 91 extend through the dielectric layer 90 and the CESL 55 to expose the source/drain structures 54. For example, as shown in FIG. 18, the source/drain structures 54 are over-etched such that the trenches 91 extend into the source/drain structures 54, so as to ensure the electrical connection between the source/drain structures 54 and the source/drain contact structures 94 that will be formed in the trenches 91.

Figure 19:
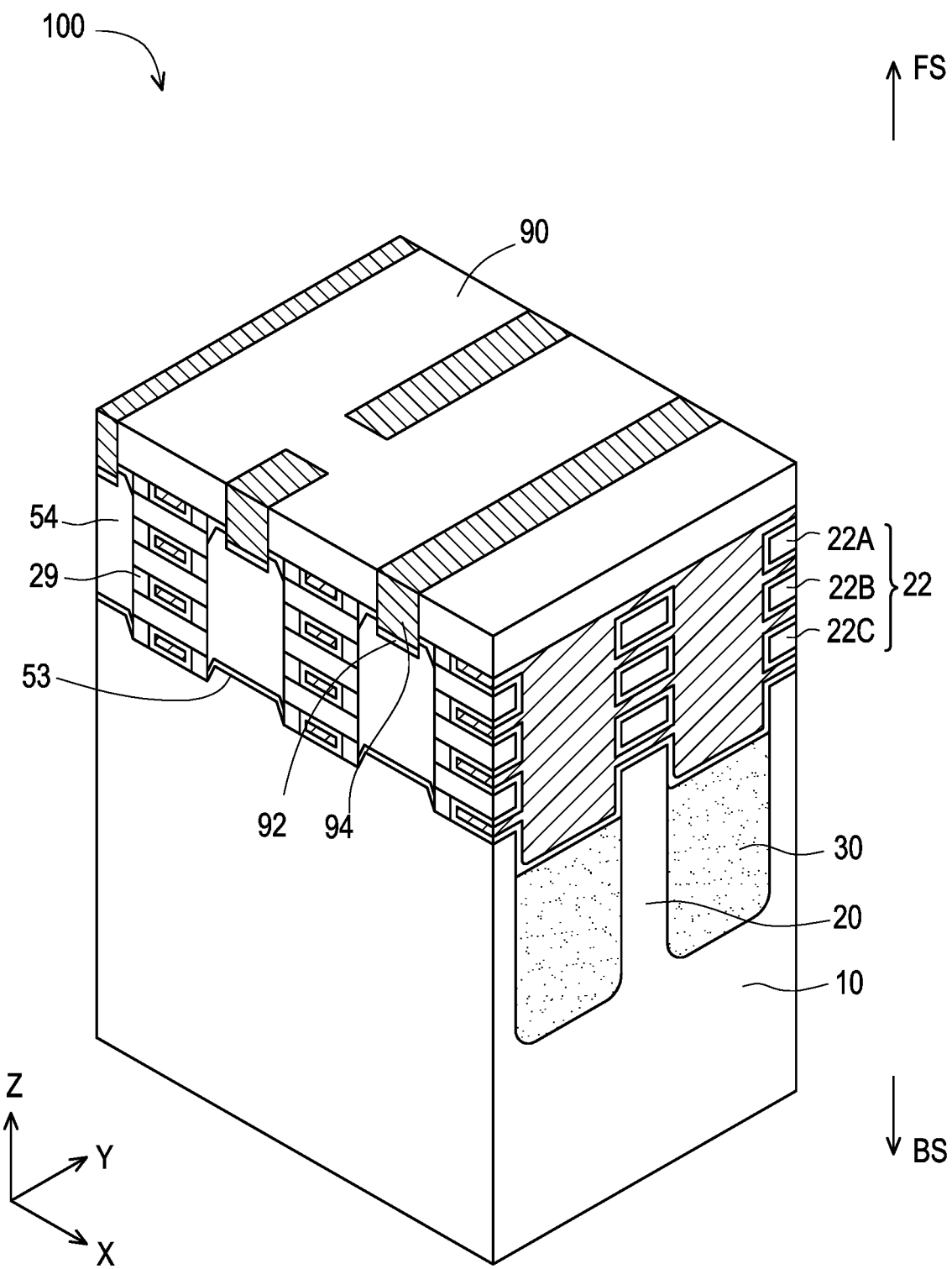

Referring to FIG. 19, after the trenches 91 are formed, silicide regions 92 are formed over the source/drain structures 54. In some embodiments, the silicide regions 92 are formed by first depositing a metal (not illustrated) over the exposed portions of the underlying source/drain structures 54, and then performing a thermal anneal process to form silicide regions 92. The metal is capable of reacting with the semiconductor materials of the source/drain structures 54 (e.g., silicon, silicon germanium, germanium) and may include nickel, cobalt, titanium, tantalum, platinum, tungsten, other noble metals, other refractory metals, rare earth metals or alloys thereof. The un-reacted portions of the deposited metal are then removed, by an etching process, for example. In some embodiments, the silicide regions 92 includes TiSi, CrSi, TaSi, MoSi, ZrSi, HfSi, ScSi, YSi, HoSi, TbSi, GdSi, LuSi, DySi, ErSi, YbSi, or the like when the underlying source/drain structures 54 are n-type, and the silicide regions 92 includes NiSi, CoSi, MnSi, Wsi, FeSi, RhSi, PdSi, RuSi, PtSi, IrSi, OsSi, or the like when the underlying source/drain structures 54 are p-type. In one embodiment, the silicide region 92 is formed with a thickness in a range between about 1 nm and about 10 nm.

In FIG. 19, source/drain contact structures 94 (also referred to as contact plugs) are formed in the trenches 91 over the silicide regions 92. The source/drain contact structures 94 may each include one or more layers, such as barrier layers, diffusion layers, and filling materials. For example, the source/drain contact structures 94 each include a barrier layer and a conductive material, and are each electrically coupled to the underlying source/drain structures 54. The barrier layer may include titanium, titanium nitride, tantalum, tantalum nitride, or the like. The conductive material may be copper, a copper alloy, silver, gold, tungsten, cobalt, ruthenium, aluminum, nickel, titanium, titanium nitride, tantalum, tantalum nitride, molybdenum, nickel, or the like. Further, a planarization process, such as a CMP, may be performed to remove excess material over surfaces of the dielectric layer 90. As illustrated in FIG. 19, top surfaces of the source/drain contact structures 94 are substantially coplanar to and levelled with a top surface of the dielectric layer 90 after the planarization process, in accordance with some embodiments.

Figure 20:
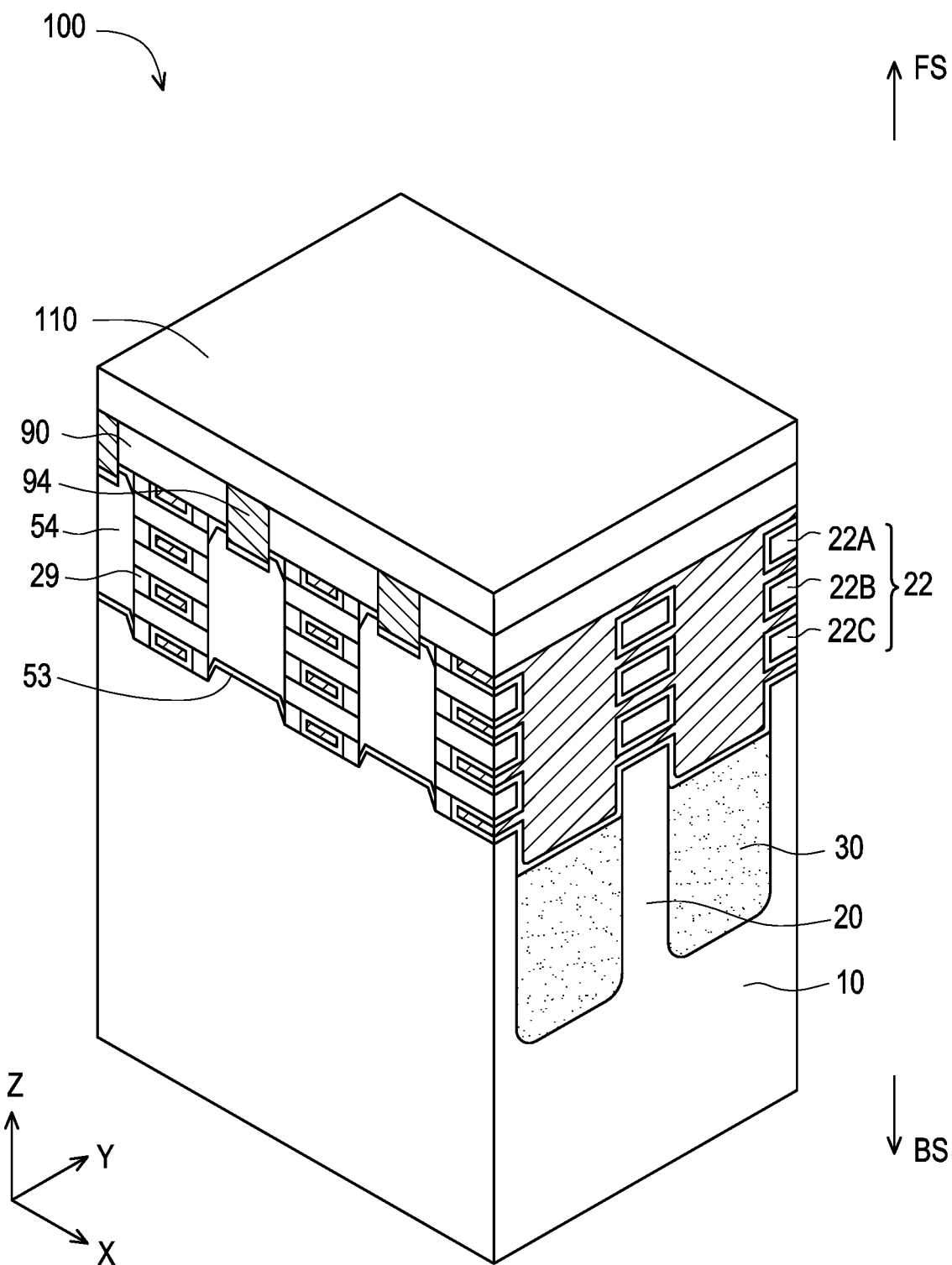

Referring to FIG. 20, a hard mask layer 110 is formed on the dielectric layer 90 and the source/drain contact structures 94. In some embodiments, the hard mask layer 110 includes dielectric material, such as SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, or the like. The hard mask layer 110 may be formed using a suitable deposition process, such as CVD or ALD. In alternative embodiments, additional processes are performed on the hard mask layer 110 to form a front-side interconnection structure (not shown), thereby allowing the interconnections between the transistor structures and the external components formed at the front-side FS of the semiconductor device 100.

Figure 21:
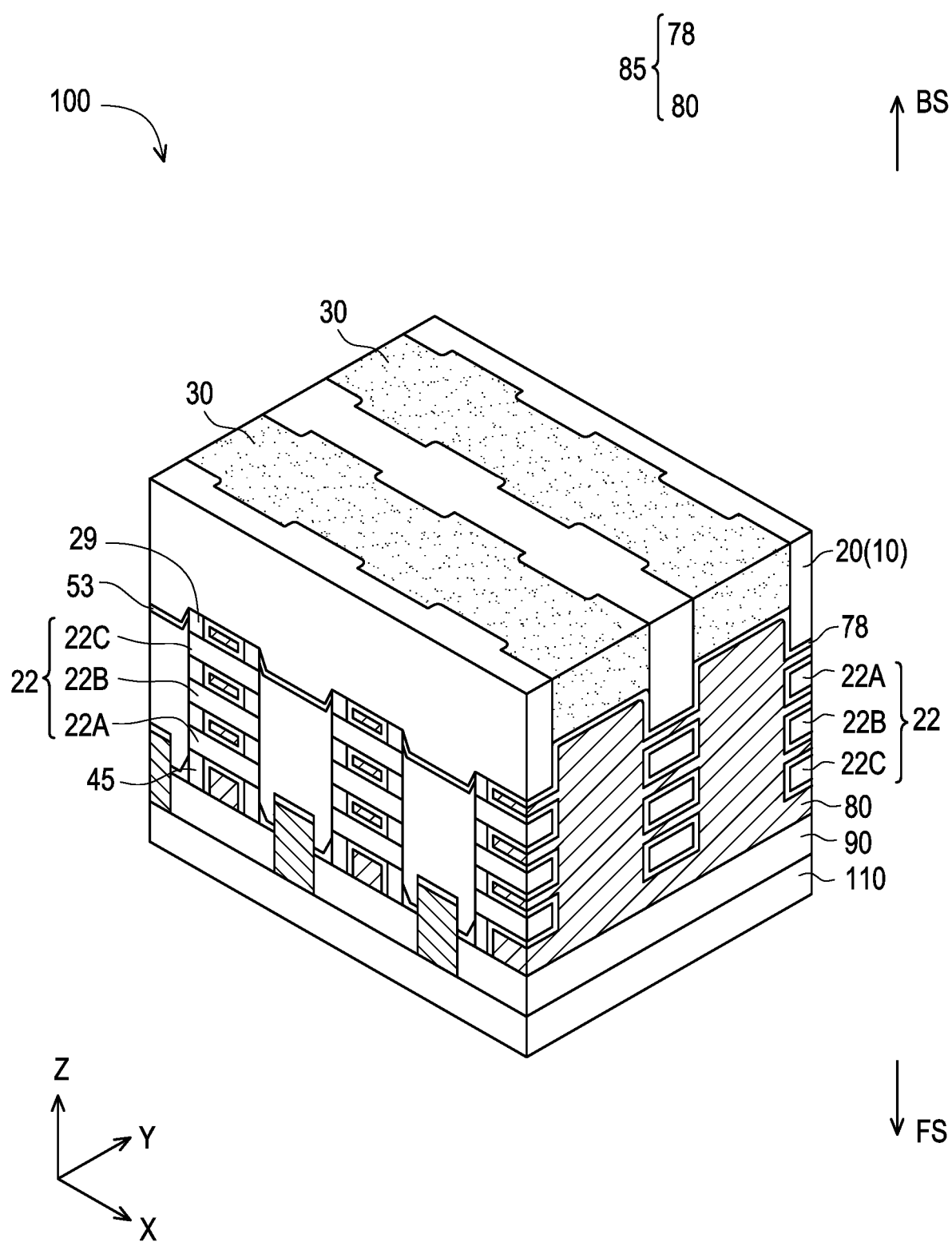

Referring to FIG. 21, the semiconductor device 100 shown in FIG. 20 is flipped upside down, and a thinning process is performed from the back-side BS, to expose the isolation regions 30 and the fins 20. The thinning process may be a CMP or an etch back process. In some embodiments, the isolation regions 30 and the fins 20 are also partially removed by the thinning process.

Figure 22:
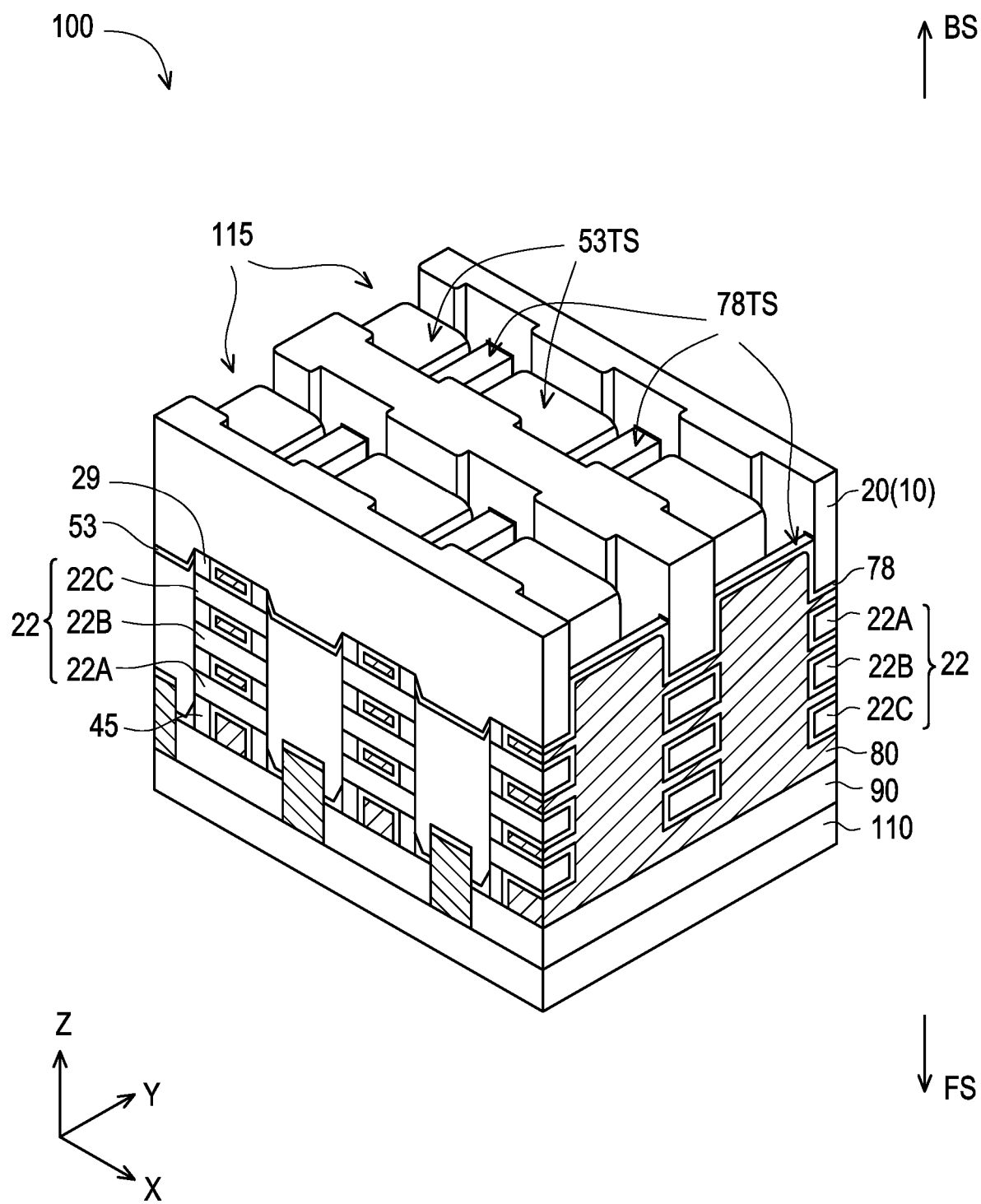

Referring to FIG. 22, the isolation regions 30 are removed using a suitable etching process, such as the plasma dry etching or wet etching. In some embodiments, the isolation regions 30 are entirely removed, such that trenches 115 that expose the dielectric layer 53 covering the CESL 55 (and the ILD layer 60) and the gate dielectric layer 78 covering the gate layer 80 are formed. Although the exposed surfaces (e.g., top surfaces) of the dielectric layer 53 are illustrated with curved profiles (also shown in FIG. 24) and the exposed surfaces (e.g., top surfaces) of the gate dielectric layer 78 are illustrated with angled profiles in FIG. 22, the profiles of the exposed surfaces of the dielectric layer 53 and the gate dielectric layer 78 are not limited herein and can be altered depending on the process variation.

Further, due to the recessing of the isolation regions 30 during the removal of the dielectric layer 27 as shown in FIG. 12, portions of the resulting gate structure 85 (e.g., at regions where the isolation regions 30 are further recessed) appear like to "protrude" from the front-side FS of the semiconductor device 100 upward to the back-side BS of the semiconductor device 100 at between adjacent fins 20, and thus the topmost surfaces 78TS of the gate dielectric layer 78 (i.e., derived from the recessed surface 30RS of the isolation region 30 shown in FIG. 16) are higher than the topmost surface 53TS of the dielectric layer 53.

Figure 23:
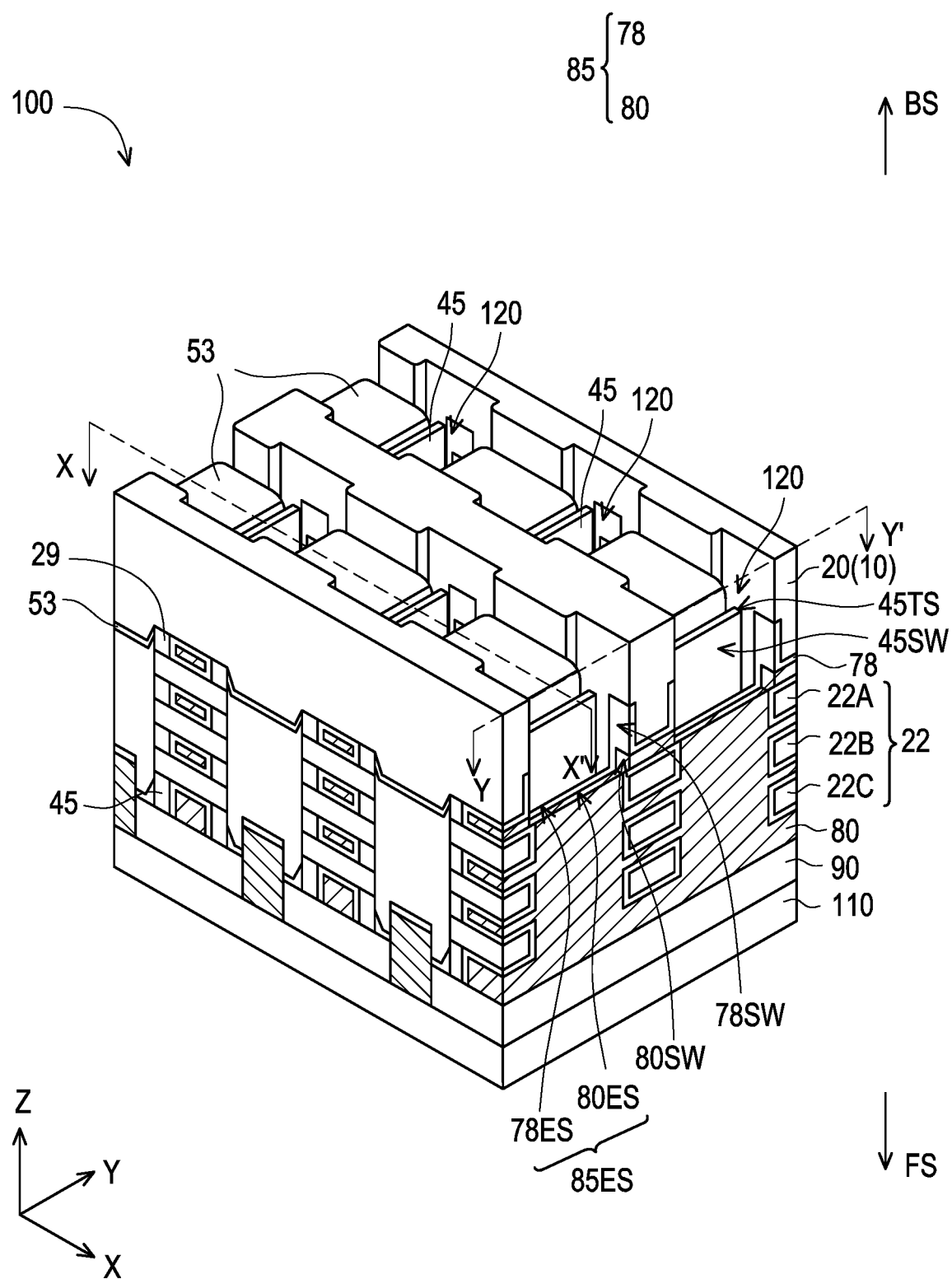
Figure 24:
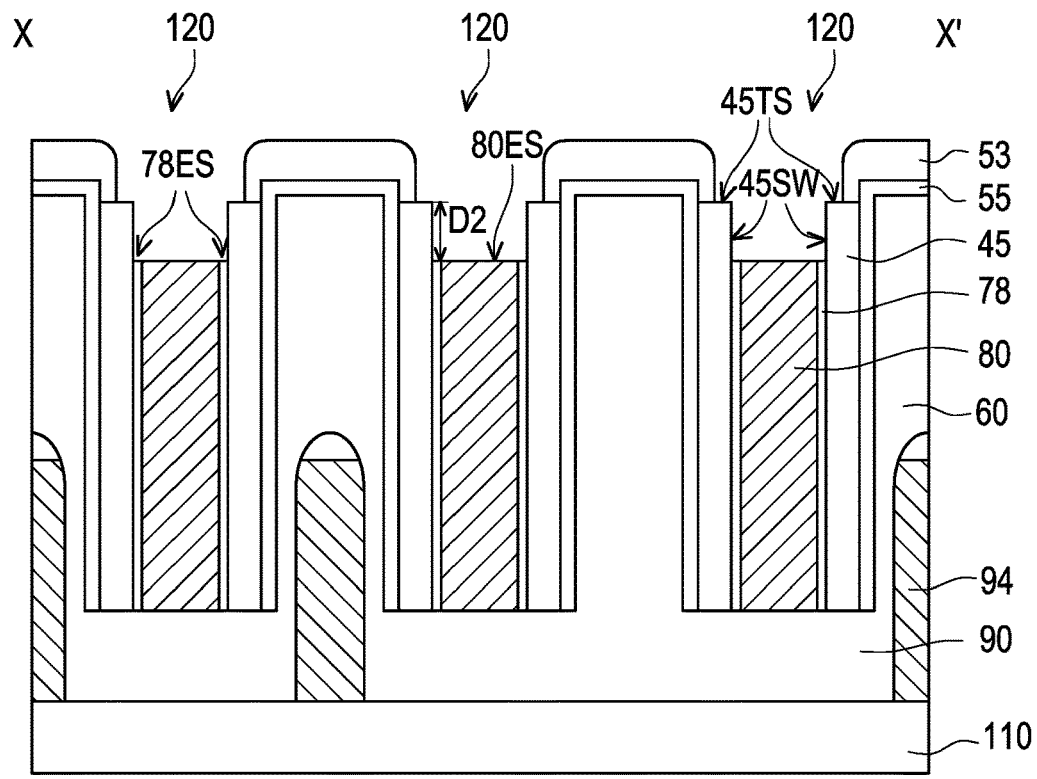
Figure 25:
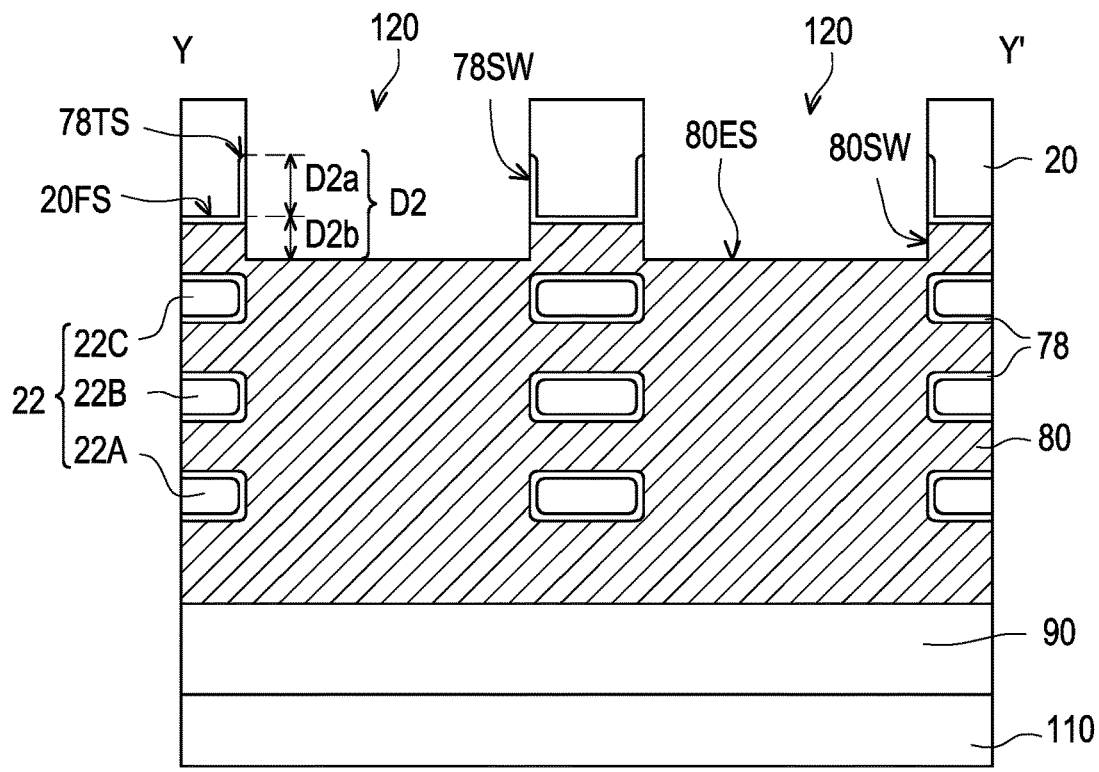

Referring to FIG. 23 through FIG. 25 together, the gate structure 85 between adjacent fins 20 and between adjacent nanostructures 22 are etched back to form recesses 120. In some embodiments, not only the aforementioned protruded portions of the gate structure 85 is removed but the gate structure 85 is further etched back such that an etched-back surface 85ES is at a position lower than the front-side surfaces 20FS of the fins 20. For example, the gate structure 85 is etched back by a vertical dimension D2 in a range between about 13 nm and about 40 nm, in accordance with some embodiments. The etch back of the gate structure 85 may be achieved using an anisotropic etching process, such as plasma dry etching process. As shown in the perspective view of FIG. 23, sidewalls 45SW of the spacers 45 beside the gate structure 85 and extended in the Y-direction are exposed after the etch back of the gate structure 85. In some embodiments, the etch back of the gate structure 85 may be referred to as a back-side gate etch back process since the etch back process is performed at the back-side BS of the semiconductor device 100.

FIG. 24 illustrates a cross-sectional view of the semiconductor device 100 taken along the cross-section line X-X' shown in FIG. 23, and FIG. 25 illustrates another cross-sectional view of the semiconductor device 100 taken along the cross-section line Y-Y' shown in FIG. 23. As shown in FIG. 24, an etched-back surface 78ES of the gate dielectric layer 78 and the etched-back surface 80ES of the gate layer 80 are coplanar with each other and at a position lower than a top surface 45TS of the spacer 45 after the etch back of the gate structure 85. In addition, the vertical dimension D2 (e.g., of the etch back) may be substantially the same as a distance between the top surface 45TS of the spacer 45 (e.g., same position with the original top surfaces of the gate dielectric layer 78 and the gate layer 80) and the etched-back surfaces 78ES, 80ES (i.e., etched-back surface 85ES).

For example, the anisotropic etch back process removes the exposed portion of the gate dielectric layer 78 between adjacent fins 20 and exposed by the trench 115 and the portion of the gate layer 80 right below the exposed portion of the gate dielectric layer 78, without etching portions of the gate dielectric layer 78 and the gate layer 80 that are collectively shielded and protected by the fins 20. That is, portions of the gate dielectric layer 78 (e.g., vertical portions and horizontal portions) that are in direct contact with the fins 20 may be remained after the back-side gate etch back process, as shown in cross-sectional view of FIG. 25. Therefore, as shown in FIG. 25, sidewalls 78SW of the etched-back gate dielectric layer 78 may be substantially coplanar to the sidewalls 80SW of the etched-back gate layer 80, and the sidewalls 78SW, 80SW may collectively form continuous straight vertical sidewalls. The vertical dimension D2 (e.g., of the etch back) may be substantially the same as a distance between the topmost surface 78TS of the etched-back gate dielectric layer 78 and the etched-back surface of the etched-back gate layer 80. In some embodiments, the vertical dimension D2 includes a first dimension D2$a$ that is substantially the same as a height of the protruded portion of the gate structure 85 and a second dimension D2$b$ that is substantially the same as a distance between the front-side surface 20FS of the fin 20 and the etched-back surface 80ES of the etched-back gate layer 80. In some embodiments, the first dimension D2$a$ is the same as the vertical dimension D1 with reference to FIG. 16, and the second dimension D2$b$ is in a range between about 10 nm and about 15 nm.

Figure 26:
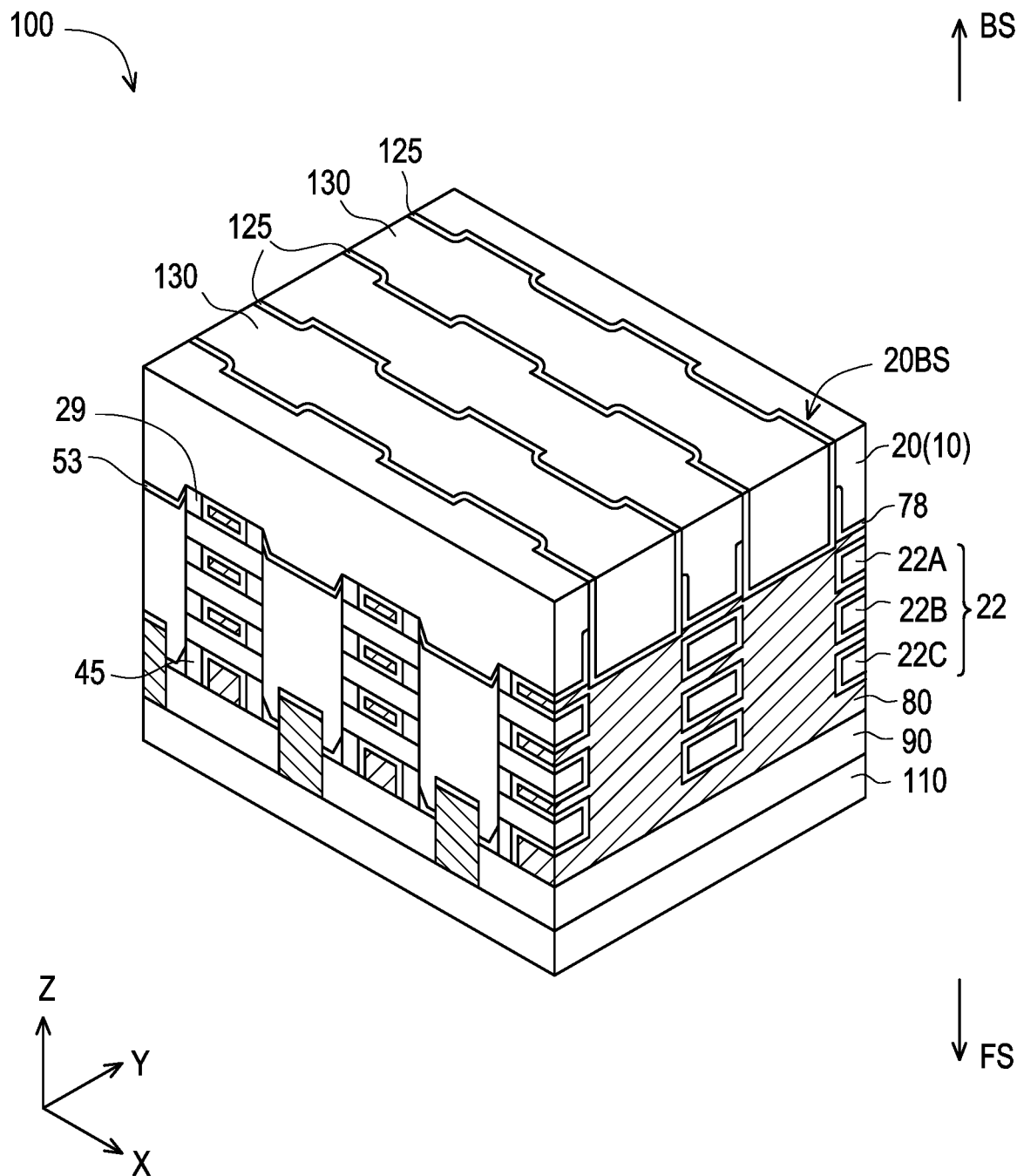
Figure 27:
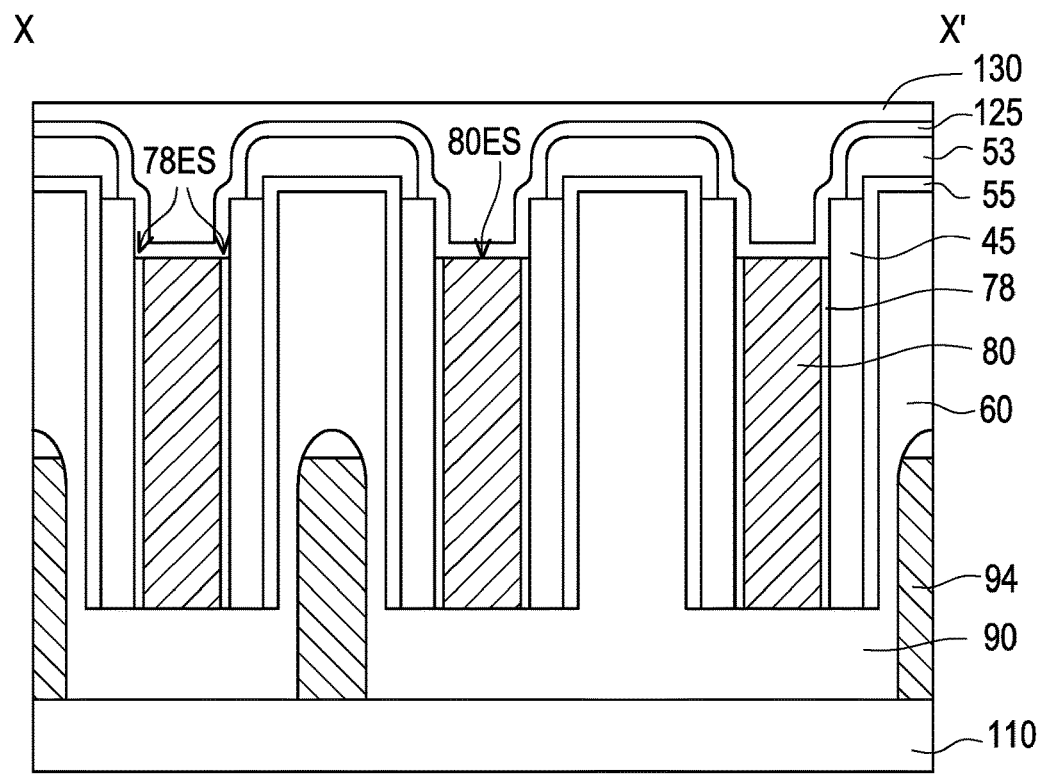
Figure 28:
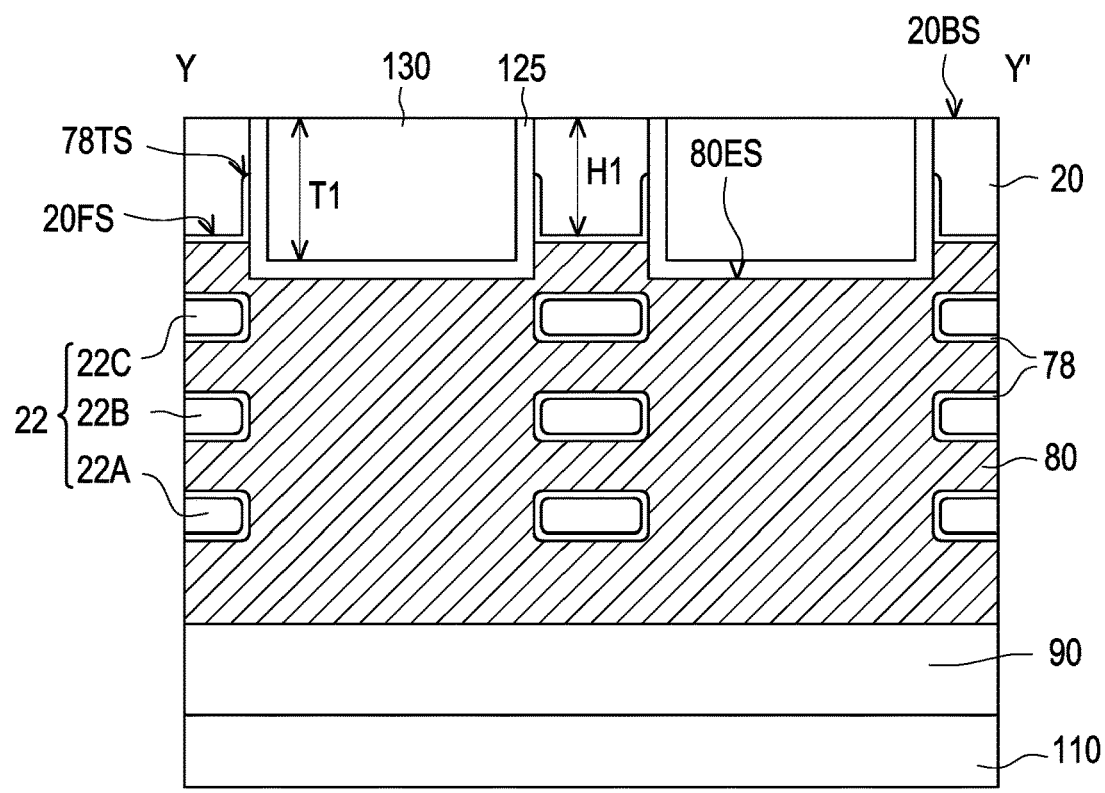

FIG. 27 illustrates a cross-sectional view of the semiconductor device 100 taken along the cross-section line X-X' shown in FIG. 26, and FIG. 28 illustrates another cross-sectional view of the semiconductor device 100 taken along the cross-section line Y-Y' shown in FIG. 26. Referring to FIG. 26 through FIG. 28 together, a dielectric liner 125 and a dielectric layer 130 is formed in the trenches 115 and the recesses 120. In some embodiments, the dielectric liner 125 includes a dielectric material, such as SiN, SiCN and is formed using, for example, CVD, ALD, or any suitable deposition process. For example, the dielectric liner 125 is conformally deposited over the surfaces exposed by the trenches 115 and the recesses 120 and over the fins 20. In some embodiments, the dielectric liner 125 serves to prevent oxidation of the underlying gate layer 80 during the following deposition process for forming the dielectric layer 130. Alternatively, the dielectric liner 125 can be omitted in embodiments where the later-formed dielectric layer 130 includes a material that does not include oxygen.

Next, the dielectric layer 130 may be formed on the dielectric liner 125 by a suitable deposition process, such as CVD or PVD to fill up the trenches 115 and the recesses 120. In some embodiments, the dielectric layer 130 includes low-k materials, such as SiO, SiOC, AlO, AlON, ZrO, HfO, TiO, ZrAlO, ZnO, SiOCN, SiOCN, SiCN, any suitable dielectric layer material, or a combination thereof. The dielectric liner 125 and the dielectric layer 130 may respectively include a material that is different from the material of the gate dielectric layer 78.

Subsequent to the deposition of the dielectric liner 125 and the dielectric layer 130, a planarization process, such as a CMP is performed to thinning the substrate 10 (e.g., the fins 20) to a desired thickness, for example. In some embodiments, after the planarization process, top surfaces of the dielectric liner 125 and the dielectric layer 130 may be substantially coplanar to and levelled with back-side surfaces 20BS of the fins 20 at a cross-section along the Y-direction, as shown in FIG. 28. In some embodiments, the fins 20 (or a thickness of the remaining substrate 10) include a height H1 (e.g., in the Z-direction) in a range between about 0.5 nm and about 20 nm after the planarization process. In alternative embodiments, the fins 20 (e.g., the substrate 10) are fully removed after the planarization process. In such embodiments, top surfaces of the dielectric liner 125 and the dielectric layer 130 are substantially coplanar with a top surface of the remaining gate dielectric layer 78.

As shown in FIG. 27 and FIG. 28, the dielectric liner 125 conformally covers the exposed surfaces (e.g., upper surfaces and sidewalls) of the fins 20, the spacers 45, the dielectric layer 53, the gate dielectric layer 78 and the gate layer 80. For example, the dielectric liner 125 is located between the dielectric layer 130 and the fin 20, between the dielectric layer 130 and the gate dielectric layer 78, and between the dielectric layer 130 and the gate layer 80. In other words, the dielectric liner 125 may directly contact to portions of the fin 20, the gate dielectric layer 78 and the gate layer 80, as shown in FIG. 28. Further, in some embodiments, the dielectric layer 130 includes a thickness T1 in a range between about 20 nm and about 50 nm.

Next, a back-side source/drain contact structures 144 connected to the source/drain structures 54 are formed at the back-side BS of the semiconductor device 100. The back-side source/drain contact structures 144 may be similar to the front-side source/drain contact structures 94 described above. The formation of the back-side source/drain contact structures 144 will be described with reference to FIG. 29 through FIG. 31 below.

Figure 29:
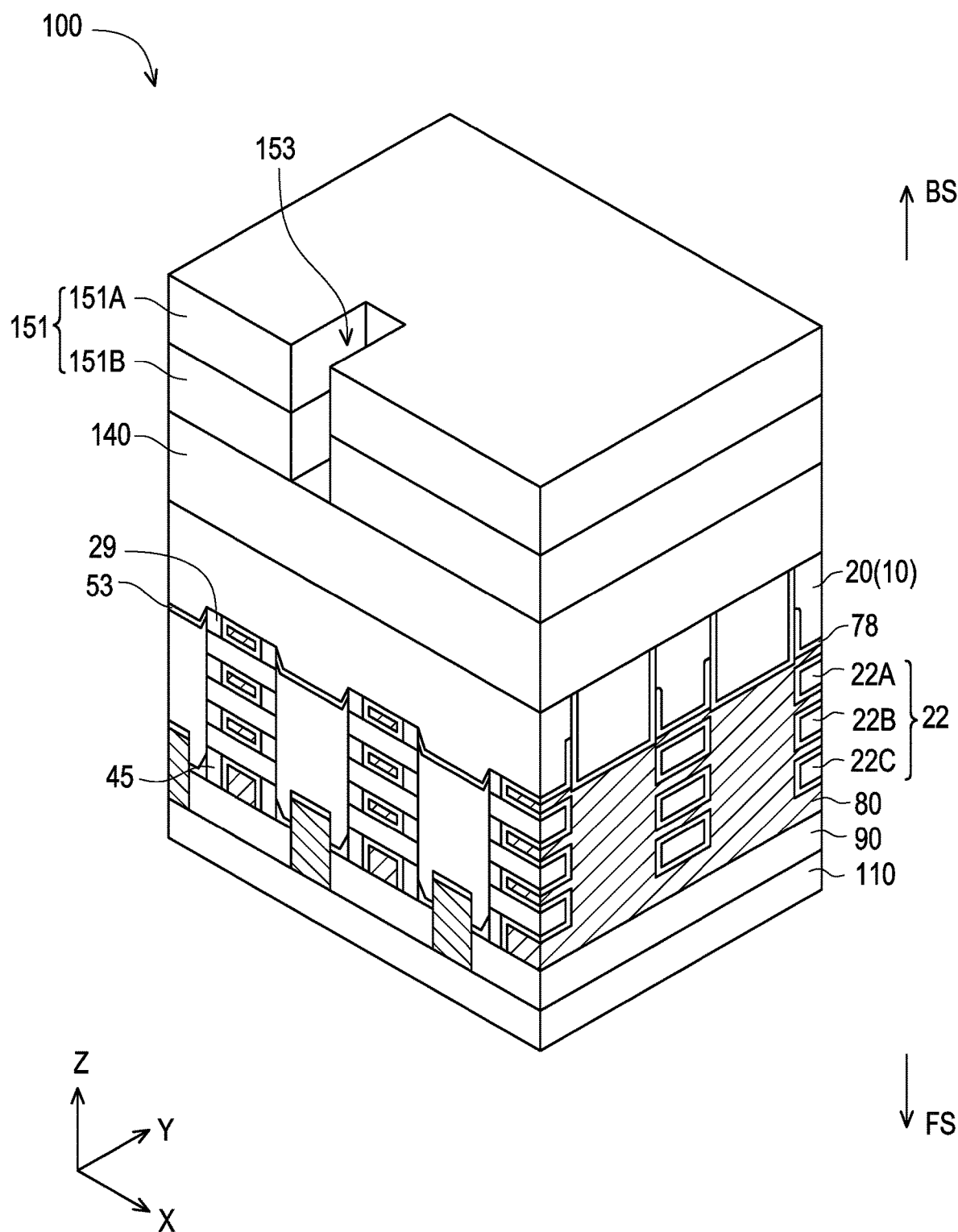

Referring to FIG. 29, a hard mask layer 140 and a photoresist stack 151 are sequentially formed over the semiconductor 100 shown in FIG. 26. In some embodiments, the hard mask layer 140 includes dielectric material, such as SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, or the like. The hard mask layer 140 may be formed using a suitable deposition process, such as CVD or ALD.

In some embodiments, the photoresist stack 151 including a bottom masking layer 151A and a top masking layer 151B is similar to those with reference to the photoresist stack 101 of FIG. 17, and the description is not repeated herein.

As shown in FIG. 29, the photoresist stack 151 is patterned to form a plurality of openings 153 in the photoresist stack 151. In some embodiments, the openings 153 are formed at locations above the locations that the back-side source/drain contact structures 144 will be later formed. It is understood that the arrangements of the opening 153 in FIG. 29 are merely examples, and can be changed based on design requirements.

Figure 30:
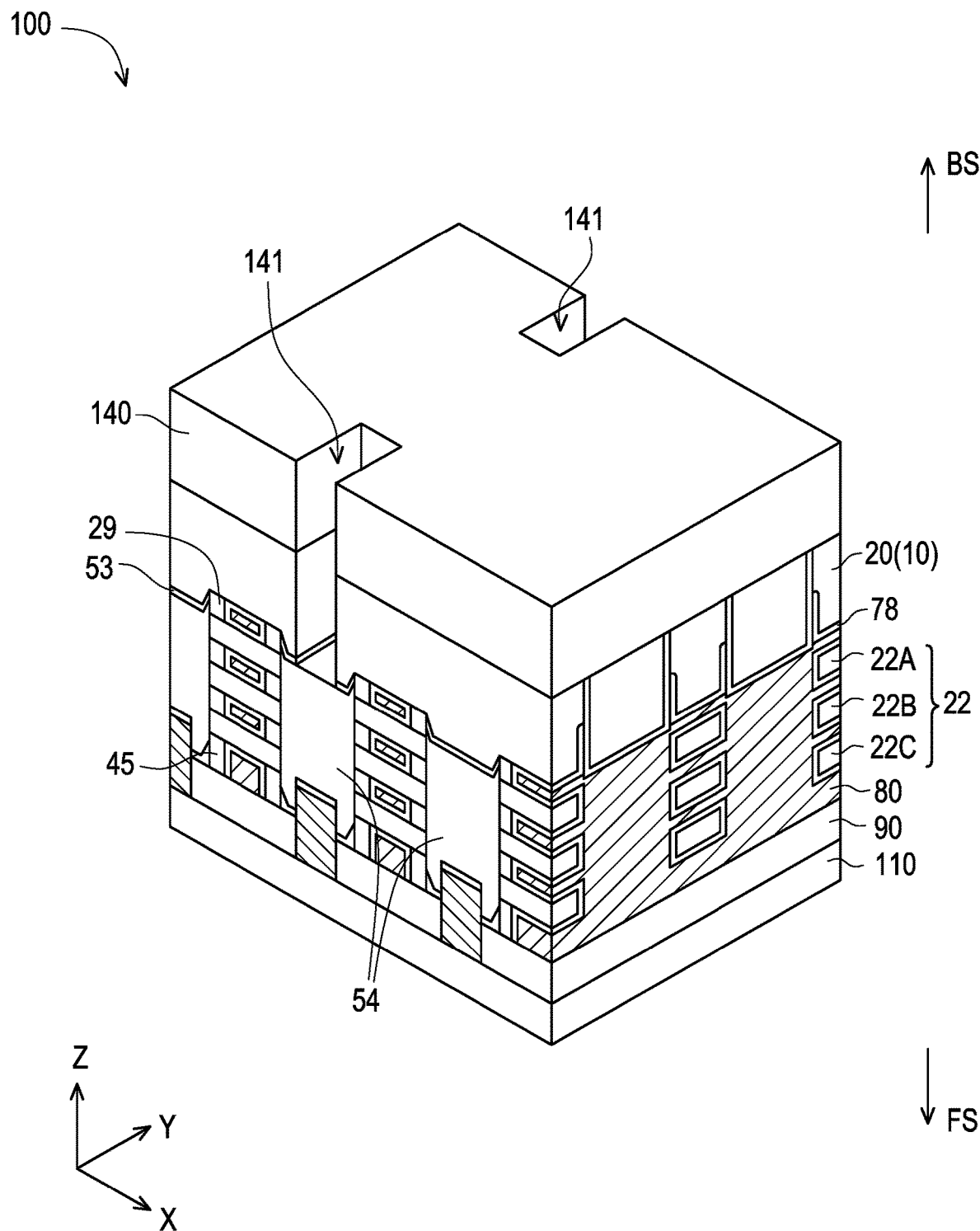

The openings 153 are then transferred to the underlying layers to form trenches 141 for accommodating later-formed source/drain contact structures 144 using any suitable etching process including wet etching, dry etching, RIE, and/or other suitable techniques. Thereafter, the photoresist stack 151 may be removed using, for example, a stripping process (e.g., a wet strip process) or an ashing process (e.g., plasma ashing process). In some embodiments, the trenches 141 extend through the dielectric layer 140, the fins 20 (e.g., the substrate 10) and the dielectric layer 53 to expose the source/drain structures 54, as shown in FIG. 30.

After the trenches 141 are formed, silicide regions 142 are formed over the source/drain structures 54. In some embodiments, the silicide regions 142 are formed of similar materials using similar techniques as those discussed above with reference to the silicide regions 92 of FIG. 19. Alternatively, the silicide regions 142 may include materials that are different from the silicide regions 92. In one embodiment, the silicide region 142 is formed with a thickness in a range between about 1 nm and about 10 nm.

Figure 31:
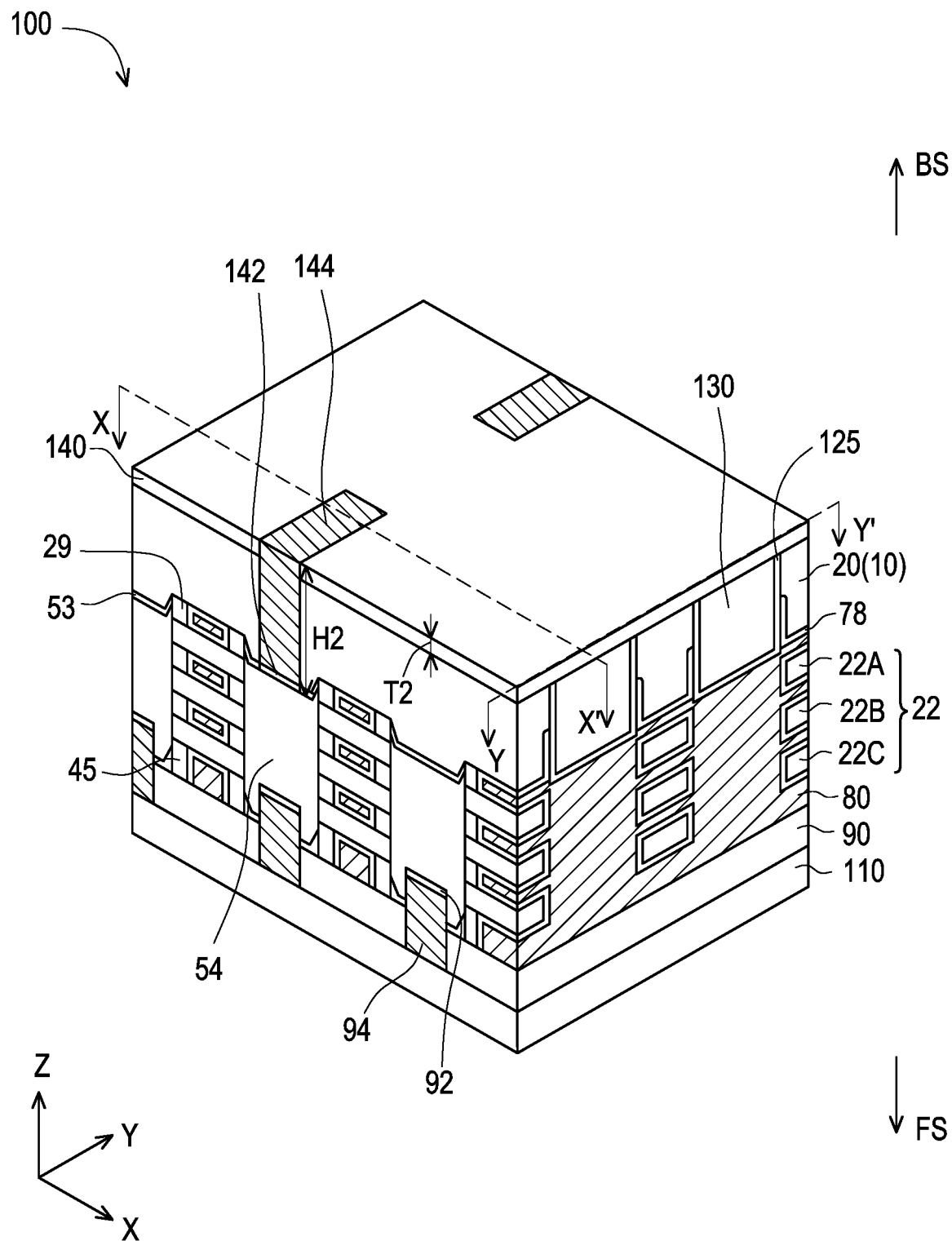

In FIG. 31, back-side source/drain contact structures 144 (also referred to as contact plugs) are formed in the trenches 141 over the silicide regions 142. The back-side source/drain contact structures 144 may be similar to, or the same as, the front-side source/drain contact structures 94, and each of the back-side source/drain contact structures 144 may include one or more layers, such as a barrier layer and a conductive material. In some embodiments, the back-side source/drain contact structures 144 are each electrically coupled to the underlying conductive source/drain contact structures 94.

Further, a planarization process, such as a CMP, may be performed to remove excess material from surfaces of the hard mask layer 140. As illustrated in FIG. 31, top surfaces of the back-side source/drain contact structures 144 are substantially coplanar to and levelled with a top surface of the hard mask layer 140 after the planarization process. In one embodiment, the hard mask layer 140 includes a thickness T2 in a range between about 5 nm and about 40 nm, and the back-side source/drain contact structures 144 each includes a height H2 (e.g., in the Z-direction) in a range between about 5 nm and about 50 nm after the planarization process.

Figure 32:
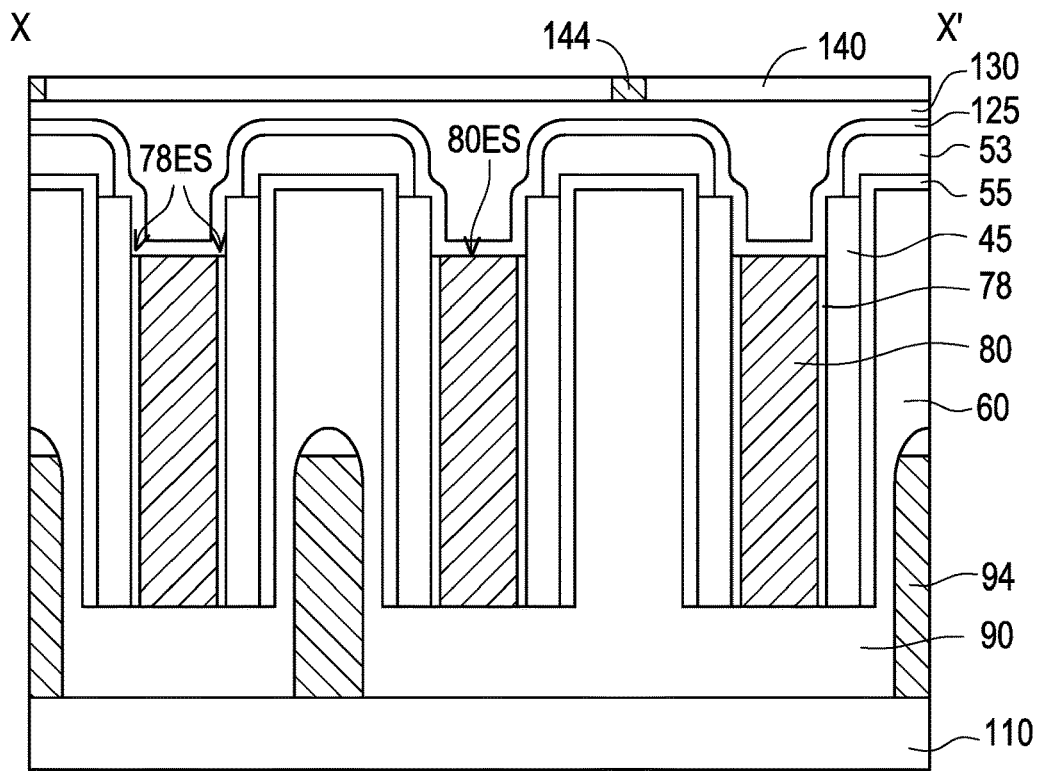
Figure 33:
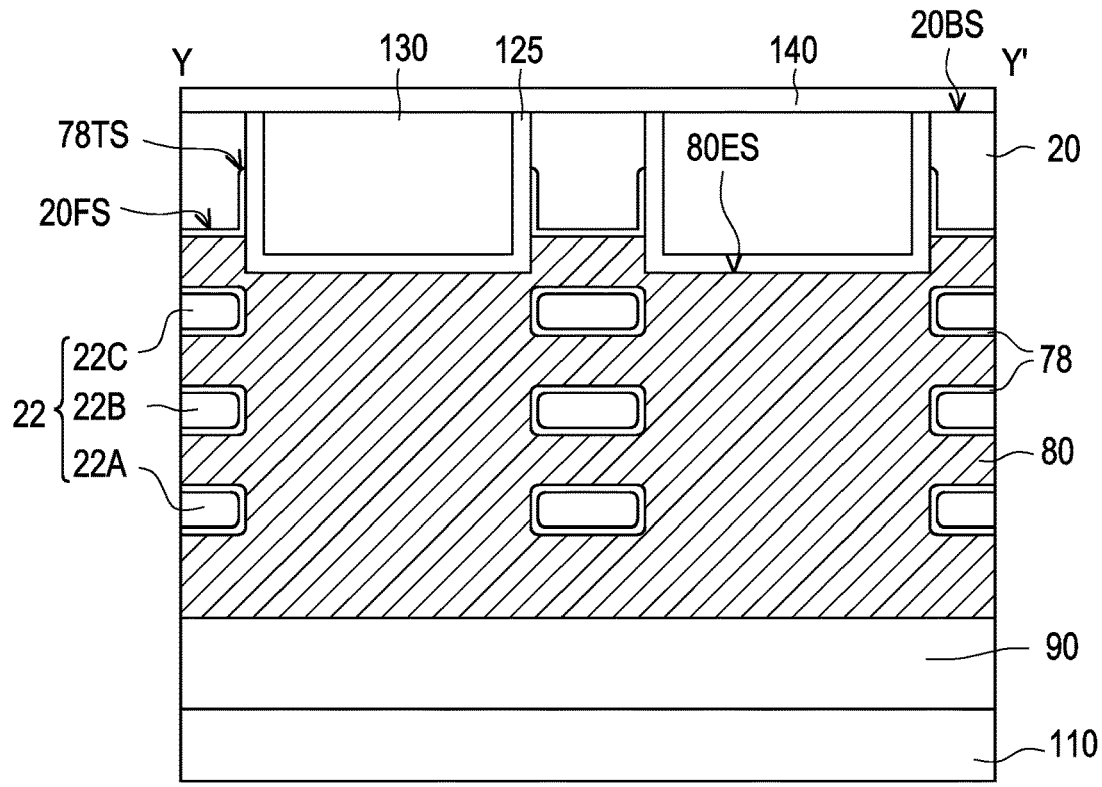

FIG. 32 illustrates a cross-sectional view of the semiconductor device 100 taken along the cross-section line X-X' shown in FIG. 31, and FIG. 33 illustrates another cross-sectional view of the semiconductor device 100 taken along the cross-section line Y-Y' shown in FIG. 31. As shown in FIG. 32 and FIG. 33, the hard mask layer 140 is formed on the fins 20, the dielectric liner 125, and the dielectric layer 130 with the back-side source/drain contact structures 144 embedded therein for electrical connection with the source/drain structure 54. It should be understood that additional processes may be performed to form additional structures (such as a back-side interconnection structure (not shown)) over hard mask layer 140 and the back-side source/drain contact structures 144, thereby allowing the interconnections between the transistor structures and the external components formed at the back-side BS of the semiconductor device 100.

Figure 34:
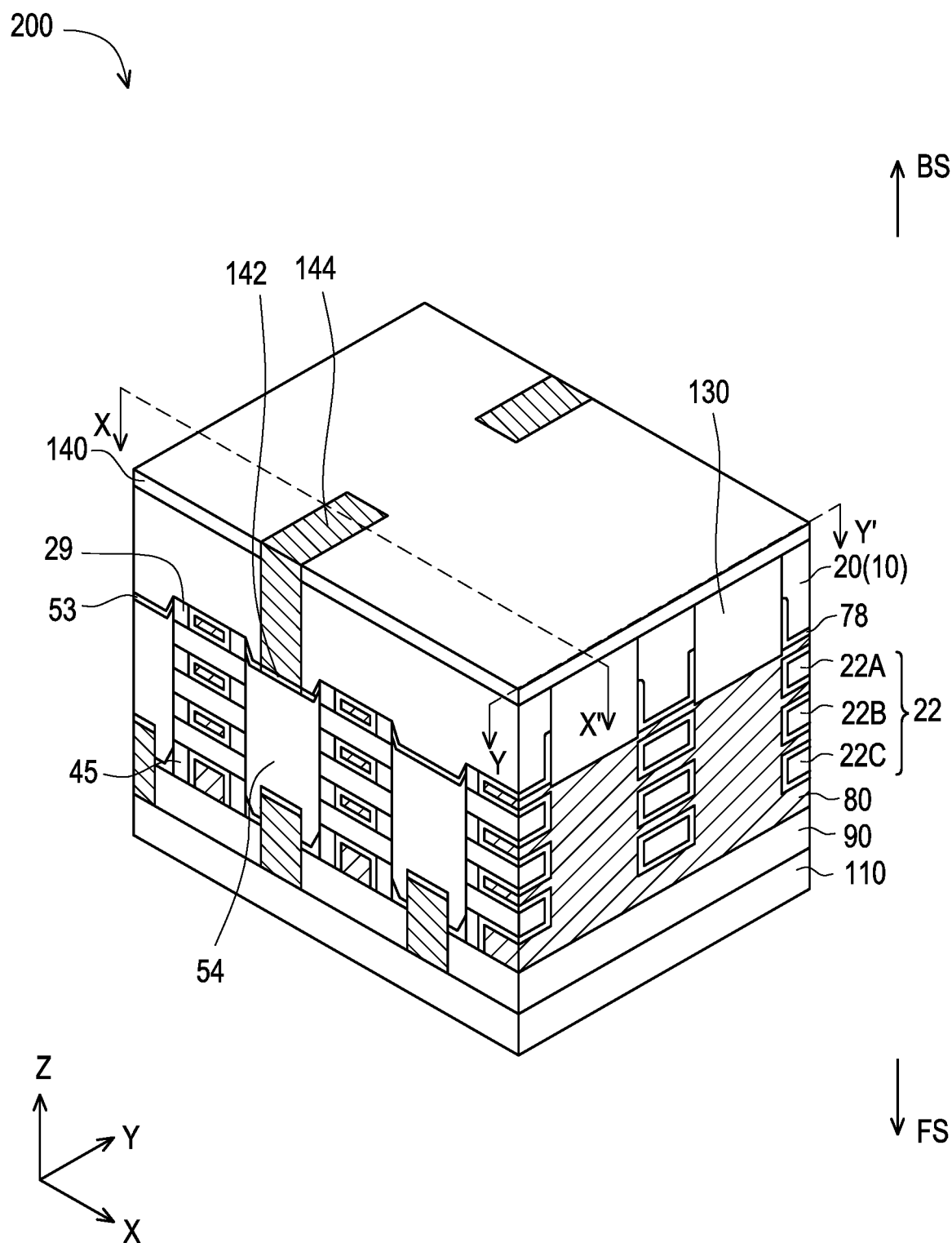
FIG. 34 through FIG. 36 are schematic perspective views and cross-sectional views of a semiconductor device in accordance with some embodiments of the disclosure.
Figure 35:
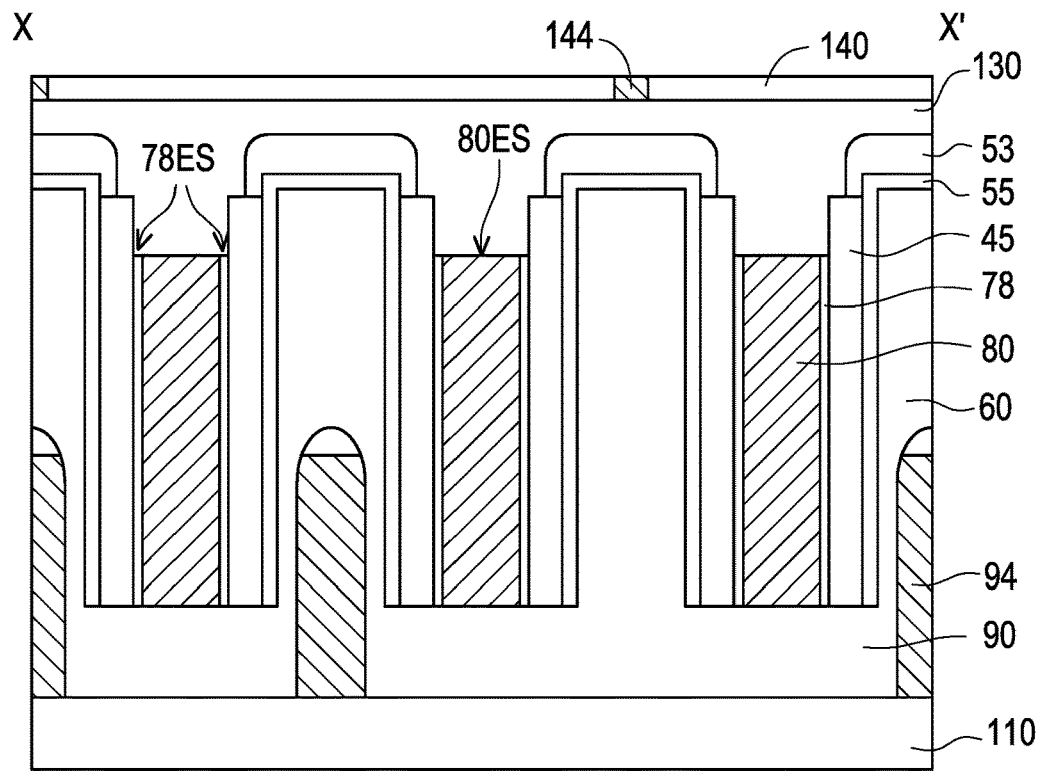
Figure 36:
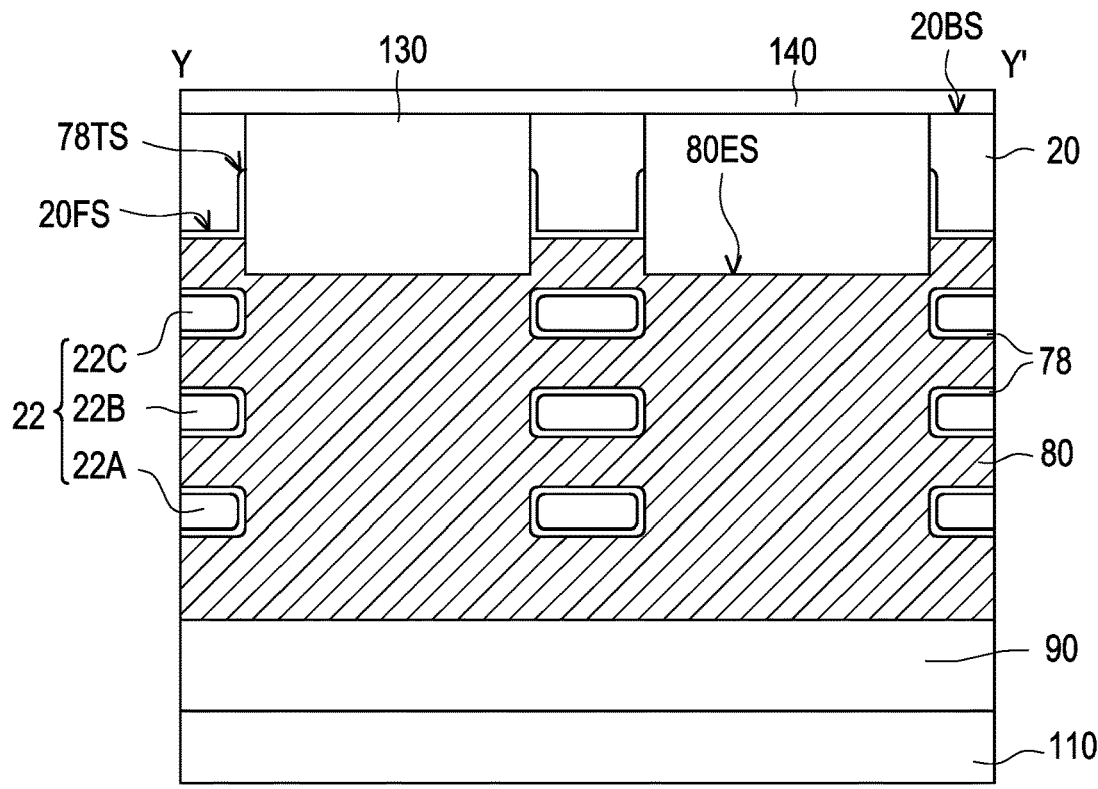

FIG. 34 through FIG. 36 are schematic perspective views and cross-sectional views of a semiconductor device 200 in accordance with some embodiments of the disclosure. FIG. 35 illustrates a cross-sectional view of the semiconductor device 200 taken along the cross-section line X-X' shown in FIG. 34, and FIG. 36 illustrates another cross-sectional view of the semiconductor device 200 taken along the cross-section line Y-Y' shown in FIG. 34. The semiconductor device 200 of FIGS. 34-36 is similar to the semiconductor device 100 of FIGS. 1-33, and the difference lies in that in the semiconductor device 200, the dielectric liner 125 is absent. That is, the dielectric layer 130 can be formed in the trenches and the recesses directly after the back-side gate etch back process is completed, such that the dielectric layer 130 is in direct contact with the fins 20, the spacers 45, the dielectric layer 53, the gate dielectric layer 78 and the gate layer 80. In such embodiments, as shown in FIG. 36, a bottom surface of the dielectric layer 130 (which is substantially coplanar to the etched-back surface 80ES) is lower than the front-side surface 20FS of the fin 20, and the dielectric layer 130 is between the vertical portions of the gate dielectric layer 78 that are in direct contact with the fins 20.

Figure 37:
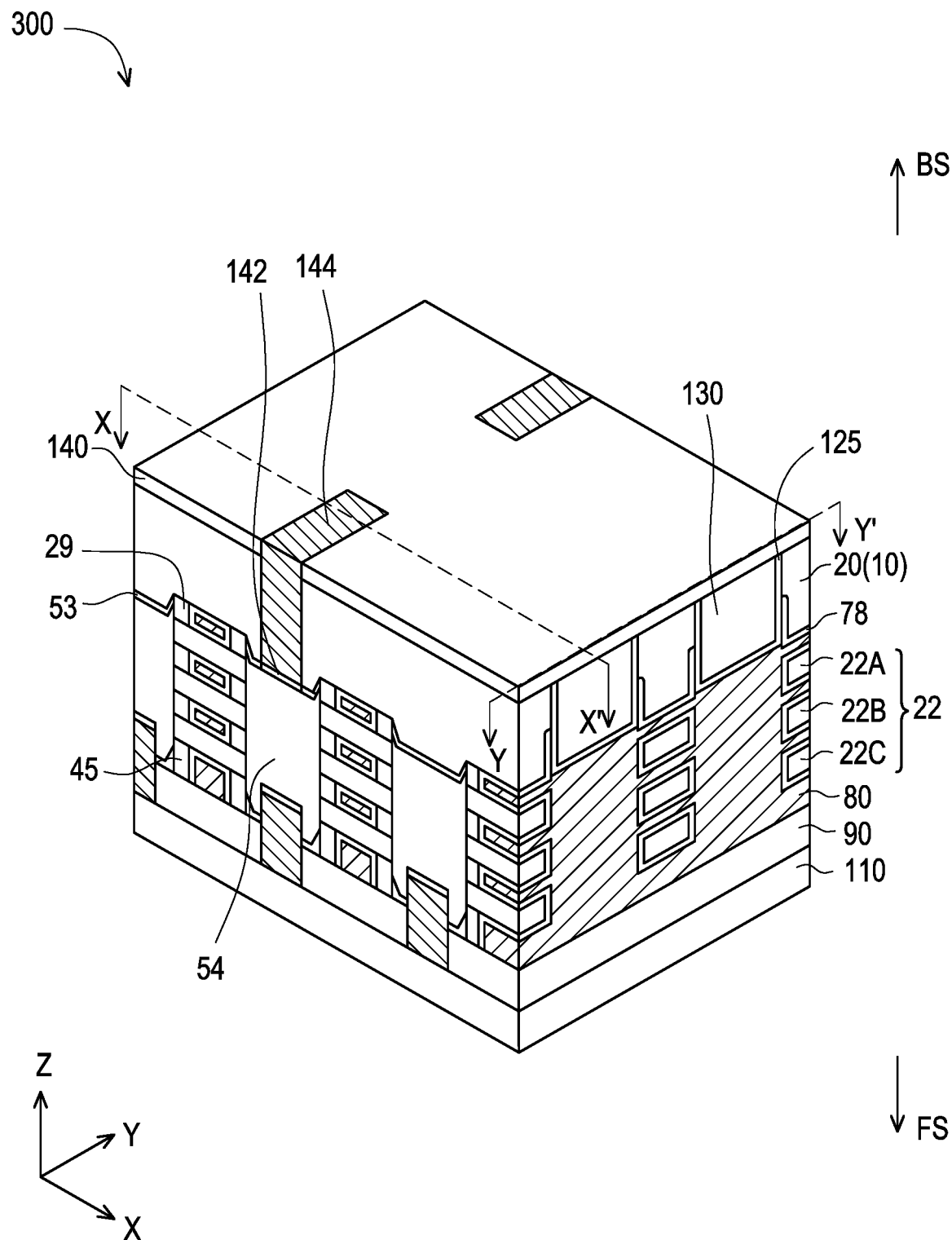
FIG. 37 through FIG. 39 are schematic perspective views and cross-sectional views of a semiconductor device in accordance with some embodiments of the disclosure.
Figure 38:
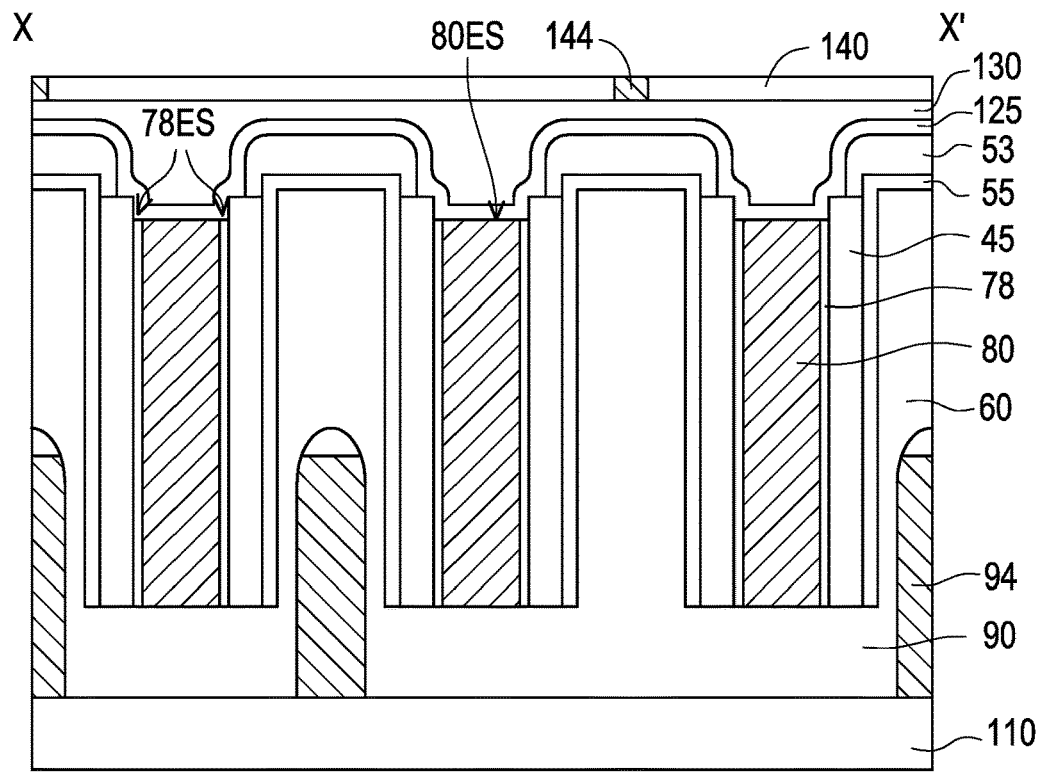
Figure 39:
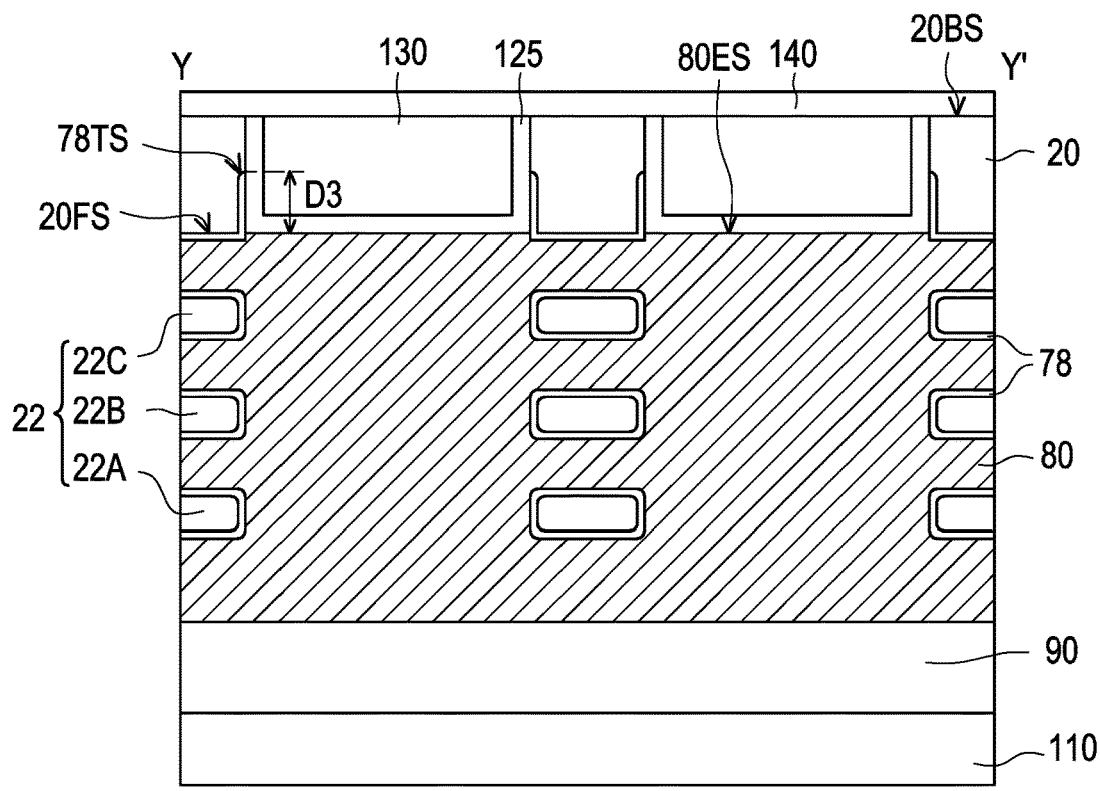

FIG. 37 through FIG. 39 are schematic perspective views and cross-sectional views of a semiconductor device 300 in accordance with some embodiments of the disclosure. FIG. 38 illustrates a cross-sectional view of the semiconductor device 300 taken along the cross-section line X-X' shown in FIG. 37, and FIG. 39 illustrates another cross-sectional view of the semiconductor device 300 taken along the cross-section line Y-Y' shown in FIG. 37. The semiconductor device 300 of FIGS. 37-39 is similar to the semiconductor device 100 of FIGS. 1-33, and the difference lies in that in the semiconductor device 300, the etched-back surface 80ES of the gate layer 80 is substantially at the same height with the front-side surface 20FS of the fin 20. In other words, the gate structure 85 is etched back by a vertical dimension D3 that is substantially the same as the height of the protruded portion of the gate structure 85 (i.e., the vertical dimension D1 with reference to FIG. 16).

Figure 40:
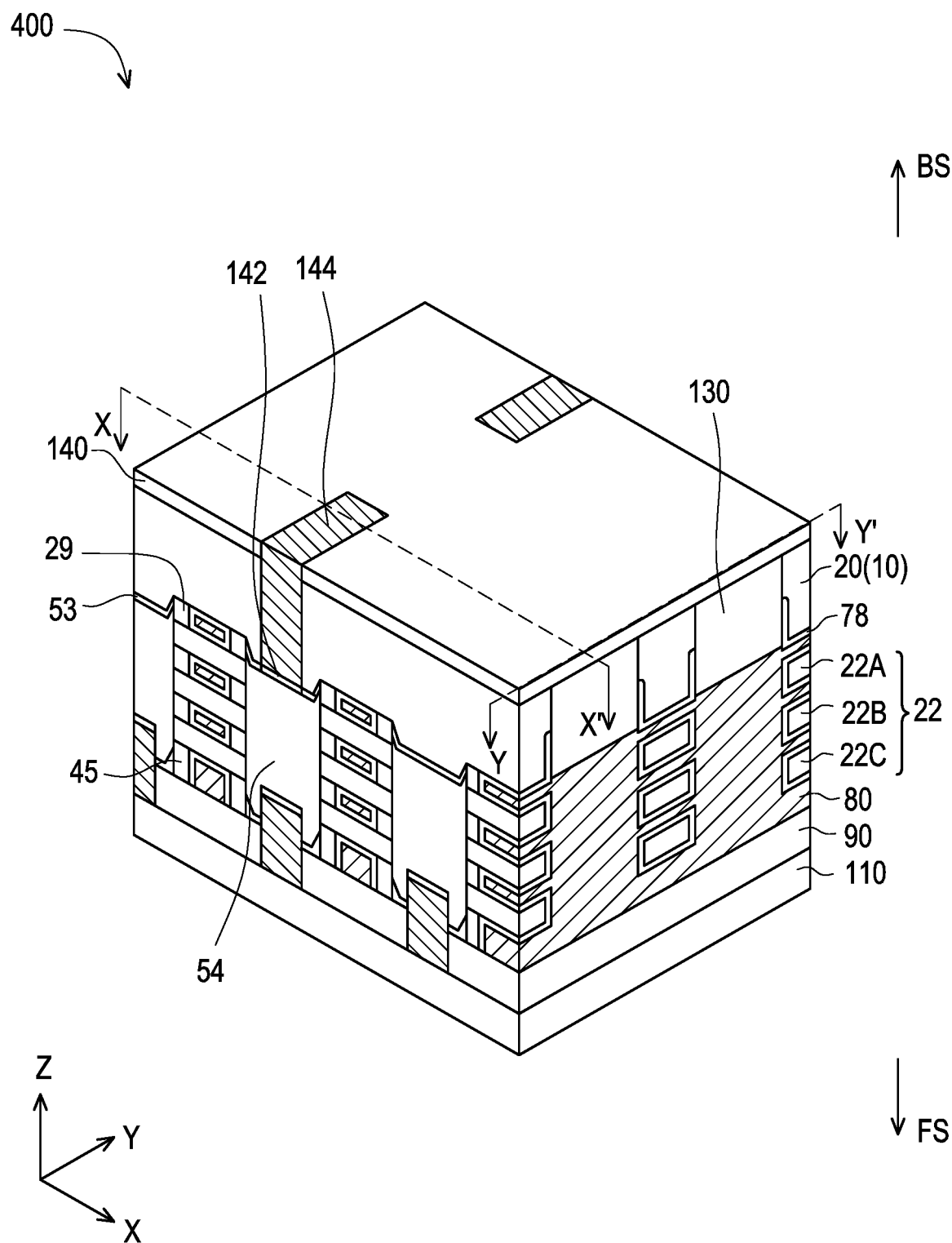
FIG. 40 through FIG. 42 are schematic perspective views and cross-sectional views of a semiconductor device in accordance with some embodiments of the disclosure.
Figure 41:
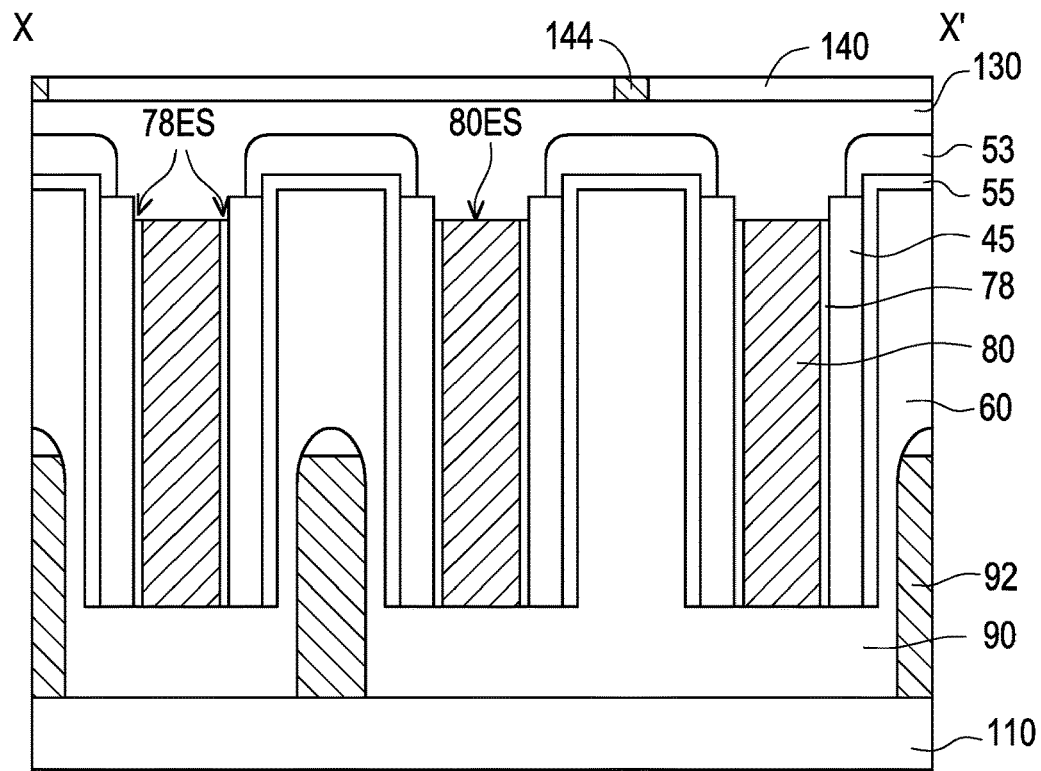
Figure 42:
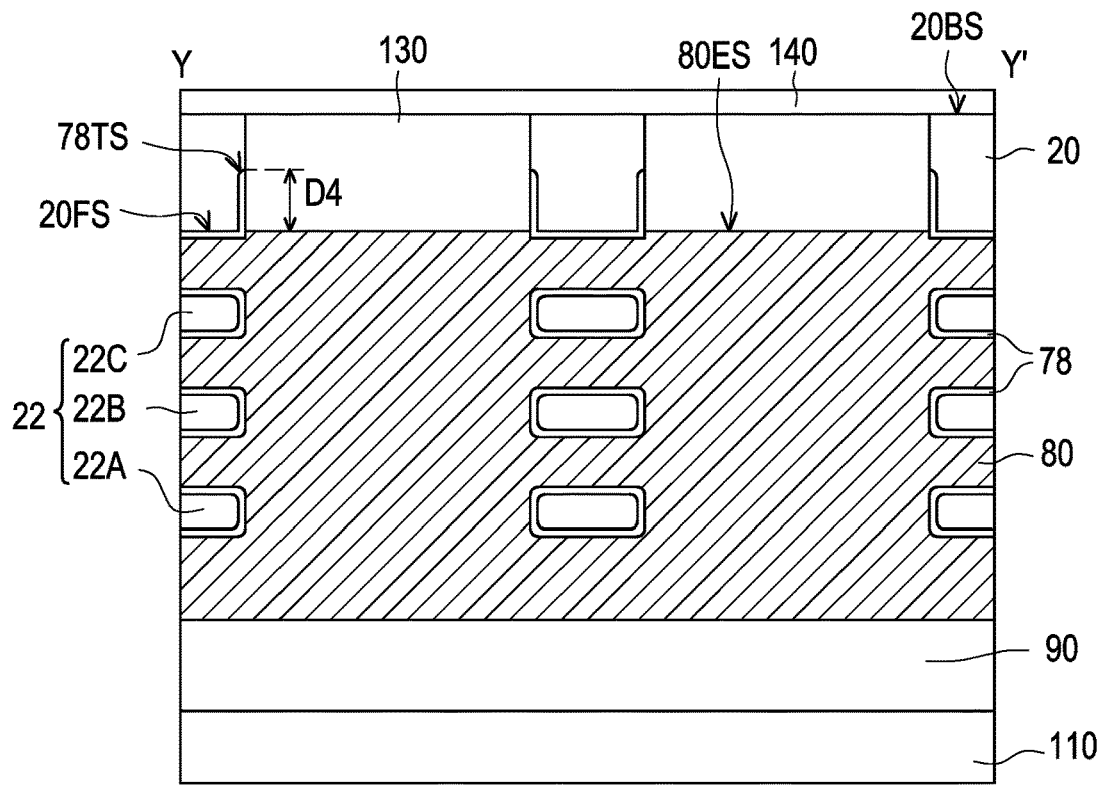

FIG. 40 through FIG. 42 are schematic perspective views and cross-sectional views of a semiconductor device 400 in accordance with some embodiments of the disclosure. FIG. 41 illustrates a cross-sectional view of the semiconductor device 400 taken along the cross-section line X-X' shown in FIG. 40, and FIG. 42 illustrates another cross-sectional view of the semiconductor device 400 taken along the cross-section line Y-Y' shown in FIG. 40. The semiconductor device 400 of FIGS. 40-43 is similar to the semiconductor device 300 of FIGS. 37-39, and the difference lies in that in the semiconductor device 400, the dielectric liner 125 is absent. For example, a vertical dimension D4 of the etchback of the gate structure 85 is substantially the same as the vertical dimension D3 with reference to the semiconductor device 300 of FIGS. 37-39.

In accordance with an embodiment of the disclosure, a semiconductor device is described. The semiconductor device includes a plurality of stacks that each includes a plurality of nanostructures stacked over each other, a gate structure wrapping around the nanostructures and extending between the stacks, source and drain structures, and a plurality of fin structures respectively disposed on the stacks. The gate structure has a first surface and a second surface opposite to the first surface, and a first surface of the gate structure between the stacks is substantially coplanar with first surfaces of the fin structures facing to the nanostructures or between the first surfaces of the fin structures and the nanostructures.

In accordance with an embodiment of the disclosure, a semiconductor device is described. The semiconductor device includes a plurality of semiconductor fins having first surfaces and second surfaces opposite to the first surfaces, nanostructure channels below the semiconductor fins, a gate dielectric layer wrapping around the nanostructure channels, a gate layer surrounding the gate dielectric layer and the nanostructure channels, source and drain structures, and a dielectric structure disposed between the semiconductor fins. The dielectric structure is different from the gate dielectric layer. A first surface of the dielectric structure is substantially coplanar with or lower than the first surfaces of the semiconductor fins.

In accordance with yet another embodiment of the disclosure, a method of manufacturing a semiconductor device is described. The method includes at least the following steps. A plurality of nanostructures is formed over a substrate. A plurality of isolation regions is formed in the substrate between the nanostructures. A plurality of source and drain structures is formed aside the nanostructures. A plurality of gate structures is formed to surround the nanostructures. The substrate is turned over. The isolation regions are removed to form a plurality of trenches. Portions of the gate structures exposed by the trenches are removed to form a plurality of recesses, such that recessed surfaces of the gate structures are substantially coplanar with or lower than a surface of the substrate facing to the nanostructures. Dielectric structures are formed to fill up the trenches and the recesses.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a plurality of stacks, each stack comprising a plurality of nanostructures stacked over each other;
    a gate structure, wrapping around the nanostructures and extending between the stacks;
    source and drain structures; and
    a plurality of fin structures, disposed on the stacks respectively, wherein a first surface of the gate structure between the stacks is between the nanostructures and first surfaces of the fin structures facing the nanostructures.

2. The semiconductor device of claim 1, further comprising:
    a first dielectric layer, disposed between the fin structures; and
    a dielectric liner, disposed between the first dielectric layer and the fin structures and between the first dielectric layer and the gate structure.

3. The semiconductor device of claim 2, wherein the dielectric liner is in direct contact with the gate structure and the fin structures.

4. The semiconductor device of claim 2, further comprising:
    a second dielectric layer covering the fin structures and the first dielectric layer; and
    a plurality of first contact plugs, wherein the first contact plugs penetrate through the second dielectric layer and the fin structures, to electrically connect to the source and drain structures.

5. The semiconductor device of claim 4, further comprising:
    a third dielectric layer below the gate structure and the source and drain structures; and
    a plurality of second contact plugs disposed opposite to the first contact plugs, wherein the second contact plugs penetrate through the third dielectric layer, to electrically connect to the source and drain structures.

6. The semiconductor device of claim 1, wherein the gate structure comprises a gate dielectric layer wrapping around the nanostructures and a gate layer surrounding the gate dielectric layer and extending between the stacks.

7. The semiconductor device of claim 6, wherein a portion of the gate dielectric layer surrounds the first surfaces of the fin structures.

8. The semiconductor device of claim 1, further comprising a dielectric layer under the source and drain structures, wherein a surface of the dielectric layer is substantially coplanar with a second surface of the gate structure.

9. A semiconductor device, comprising:
a plurality of semiconductor fins, having first surfaces and second surfaces opposite to the first surfaces, wherein the semiconductor fins are physically separated from each other;
nanostructure channels below the semiconductor fins;
a gate dielectric layer, wrapping around the nanostructure channels;
a gate layer, surrounding the gate dielectric layer and the nanostructure channels;
source and drain structures; and
a dielectric structure different from the gate dielectric layer, disposed between the semiconductor fins, wherein a first surface of the dielectric structure is substantially coplanar with or lower than the first surfaces of the semiconductor fins.

10. The semiconductor device of claim 9, wherein the dielectric structure is in direct contact with the gate layer.

11. The semiconductor device of claim 9, wherein the dielectric structure comprises:
a first dielectric layer; and
a dielectric liner, surrounding the first dielectric layer and in direct contact with the semiconductor fins and the gate layer.

12. The semiconductor device of claim 11, wherein surfaces of the first dielectric layer and the dielectric liner are substantially coplanar with the second surfaces of the semiconductor fins.

13. The semiconductor device of claim 9, wherein the dielectric structure is disposed between portions of the gate dielectric layer which are in direct contact with the semiconductor fins.

14. The semiconductor device of claim 9, wherein the first surface of the dielectric structure is disposed at the height lower than a surface of the gate dielectric layer which is in direct contact with the semiconductor fin, and the surface of the gate dielectric layer faces the nanostructure channels.

15. The semiconductor device of claim 9, wherein the first surface of the dielectric structure is disposed at the height higher than a surface of the gate dielectric layer which is in direct contact with the semiconductor fin, and the surface of the gate dielectric layer faces the nanostructure channels.

16. A semiconductor device, comprising:
a plurality of nanosheets stacked over each other;
a plurality of fin structures physically separated from each other, disposed on the nanosheets;
a gate structure on opposite sides of the fin structures, wrapping around the nanostructures and between the fin structures and the nanostructures; and
a plurality of first dielectric layers, wherein a first surface of one of the fin structures interfacing with the gate structure is substantially coplanar with a first surface of one of the first dielectric layers interfacing with the gate structure.

17. The semiconductor device of claim 16, wherein the fin structures and the first dielectric layers are arranged along a first direction and extended along a second direction substantially perpendicular to the first direction, and the nanosheets are stacked over each other along a third direction substantially perpendicular to the first direction and the second direction.

18. The semiconductor device of claim 16, further comprising:
source and drain structures;
first contacts, electrically connected to the source and drain structures and extending through the fin structures; and
second contacts, electrically connected to the source and drain structures and extending through a second dielectric layer, wherein the second dielectric layer and the fin structures are disposed on opposite surfaces of the gate structure.

19. The semiconductor device of claim 16, wherein a second surface opposite to the first surface of the one of the fin structures is substantially coplanar with a second surface opposite to the first surface of the one of the first dielectric layers.

20. The semiconductor device of claim 16, wherein the gate structure comprises a gate dielectric layer, and a surface of the gate dielectric layer on a sidewall of the one of the fin structures is between the first surface and a second surface opposite to the first surface of the one of the fin structures.

* * * * *